US010776149B2

(12) United States Patent
Kommula et al.

(10) Patent No.: US 10,776,149 B2
(45) Date of Patent: Sep. 15, 2020

(54) METHODS AND APPARATUS TO ADJUST ENERGY REQUIREMENTS IN A DATA CENTER

(71) Applicant: VMware, Inc., Palo Alto, CA (US)

(72) Inventors: Raja Kommula, Cupertino, CA (US); Thayumanavan Sridhar, Sunnyvale, CA (US)

(73) Assignee: VMware, Inc., Palo Alto, CA (US)

( * ) Notice: Subject to any disclaimer, the term of this patent is extended or adjusted under 35 U.S.C. 154(b) by 123 days.

(21) Appl. No.: 16/045,547

(22) Filed: Jul. 25, 2018

(65) Prior Publication Data

US 2020/0034171 A1 Jan. 30, 2020

(51) Int. Cl.
| G06F 9/46 | (2006.01) |
| G06F 9/455 | (2018.01) |
| G06F 9/48 | (2006.01) |
| G06F 1/20 | (2006.01) |
| H05K 7/20 | (2006.01) |
| G06F 1/3203 | (2019.01) |

(52) U.S. Cl.
CPC .......... *G06F 9/45558* (2013.01); *G06F 1/206* (2013.01); *G06F 1/3203* (2013.01); *G06F 9/4893* (2013.01); *H05K 7/20836* (2013.01); *G06F 2009/4557* (2013.01)

(58) Field of Classification Search
None
See application file for complete search history.

(56) References Cited

U.S. PATENT DOCUMENTS

| 7,127,625 B2 | 10/2006 | Farkas et al. |
| 7,152,142 B1 | 12/2006 | Guha et al. |
| 7,644,051 B1 | 1/2010 | Moore et al. |
| 7,644,148 B2 | 1/2010 | Ranganathan et al. |
| 8,397,088 B1 | 3/2013 | Ghose |
| 8,448,006 B2 | 5/2013 | Floyd et al. |
| 8,457,807 B2 | 6/2013 | Nastacio |
| 8,595,515 B1 | 11/2013 | Weber et al. |
| 8,813,080 B2 | 8/2014 | Fenger et al. |

(Continued)

OTHER PUBLICATIONS

Alcorn, "CPU Hierarchy 2018: Intel and AMD Processors Ranked," May 30, 2018, retrieved from [https://www.tomshardware.com/reviews/cpu-hierarchy,4312.html] on Jul. 25, 2018, 4 pages.

(Continued)

*Primary Examiner* — Gregory A Kessler
(74) *Attorney, Agent, or Firm* — Hanley, Flight & Zimmerman, LLC

(57) ABSTRACT

A disclosed example includes determining that first virtual machines (VMs) corresponding to a first percentage resource utilization indicative of resource usage of a first rack cause the first rack to generate a threshold amount of heat; determining, based on a second percentage resource utilization indicative of resource usage of a second rack, to migrate the first VMs to the second rack to reduce a temperature in a first room by at least the threshold amount of heat; migrating the first VMs from the first rack of the first room to the second rack of a second room; placing the first rack in a low-power state based on the migration of the first VMs to the second rack; and sending a temperature control signal to a climate control system to adjust a cooling process of the climate control system based on the first rack being in the low-power state.

18 Claims, 14 Drawing Sheets

(56) References Cited

U.S. PATENT DOCUMENTS

| | | |
|---|---|---|
| 8,880,225 B2 | 11/2014 | Iyengar et al. |
| 9,557,792 B1 | 1/2017 | Potlapally et al. |
| 2011/0077795 A1 | 3/2011 | VanGilder et al. |
| 2011/0107126 A1 | 5/2011 | Goodrum |
| 2013/0128455 A1 | 5/2013 | Koblenz et al. |
| 2016/0087909 A1 | 3/2016 | Chatterjee et al. |
| 2016/0234972 A1 | 8/2016 | Billet et al. |
| 2017/0255239 A1 | 9/2017 | Matteson et al. |
| 2017/0264493 A1 | 9/2017 | Cencini et al. |
| 2018/0026910 A1 | 1/2018 | Balle et al. |
| 2019/0272017 A1 | 9/2019 | Ghose |
| 2020/0037473 A1 | 1/2020 | Kommula et al. |

OTHER PUBLICATIONS

Wikipedia, "PowerPC 7xx," last edited on May 9, 2018, retrieved from [https://en.wikipedia.org/wiki/PowerPC_7xx] on Jul. 25, 2018, 4 pages.

Wikipedia, "Comparison of Intel processors," last edited on Jul. 5, 2018, retrieved from [https://en.wikipedia.org/wiki/Comparison_of_Intel_processors] on Jul. 25, 2018, 3 pages.

Wikipedia, "List of CPU power dissipation figures," last edited on Jan. 14, 2018, retrieved from [https://en.wikipedia.org/wiki/List_of_CPU_power_dissipation_figures] on Jul. 25, 2018, 76 pages.

United States Patent and Trademark Office, "Non-Final Office Action," dated Apr. 6, 2020 in connection with U.S. Appl. No. 16/045,549, 15 pages.

Lefurgy et al., "Energy-Efficient Data Centers and Systems," 2011 IEEE International Symposium on Workload Characterization, Austin, Texas, Nov. 6, 2011, 214 pages.

Jin et al., "Green Data Centers: A Survey, Perspectives, and Future Directions," ArXiv, vol. abs/1608.00687, Aug. 2, 2016, 20 pages.

Minas et al., "The Problem of Power Consumption in Servers," Intel Corporation, Energy Efficiency for Information Technology, 2009.

Dayarathna et al., "Data Center Energy Consumption Modeling: A Survey," IEEE Communications Surveys & Tutorials, vol. 18, No. 1, First Quarter 2016, published Sep. 28, 2015, 63 pages.

Chaudhry et al., "Minimizing Thermal Stress for Data Center Servers through Thermal-Aware Relocation," Hindawi Publishing Corp., The Scientific World Journal, vol. 2014, Article ID 684501, Mar. 31, 2014, 9 pages.

Bai et al., "Comparative Study of Energy Performance between Chip and Inlet Temperature-Aware Workload Allocation in Air-Cooled Data Center," Energies 2018, 11, 669; doi:10.3390/en11030669, Mar. 16, 2018, 23 pages.

Antal et al., "Transforming Data Centers in Active Thermal Energy Players in Nearby Neighborhoods," Sustainability 2018, 10, 939; doi:10.3390/su10040939, Mar. 23, 2018, 20 pages.

600

```
app_list = {list of all applications in DC}
total_resource_usage = 0
foreach app in app_list
app_resource_usage[app] = 0
foreach vm in app
total_resource_usage += vm_resource_usage(vm)
app_resource_usage[app] += vm_resource_usage(vm)
endfor
endfor
if (total_resource_usage*100/total_resources_in_dc) < 70
return CAN_BE_OPTIMIZED
endif
```

| POWER PC CPU POWER USAGE TABLE | | | | |
|---|---|---|---|---|
| MODEL | LITHOGRAPHY | CLOCK SPEED | VCORE | POWER |
| DUAL-CORE POWERPC MPC8641D | 90 nm | 2 GHz | 1.2 V | 15-25 W |
| POWERPC 750FX | 0.13 μm | 900 MHz | 1.2 V | 3.6 W |
| POWERPC 750CXe | 0.18 μm | 600 MHz | 1.8 V | 6 W |
| POWERPC MGT560 | 0.20 μm | 56 MHz | 2.7 V | 0.5 W |
| POWERPC 440GX | | 800 MHz | | 4.5 W |
| POWERPC 970 | | 1.8 GHz | 1.3 V | 42 W |
| POWERPC 7400e | | 1.0 GHz | 1.6 V | 30 W |

| INTEL CPU POWER USAGE TABLE | | | |
|---|---|---|---|
| MODEL | LITHOGRAPHY | CLOCK SPEED | POWER |
| CORE i7-4820K | IVY BRIDGE-E (22 nm) | 3.7 GHz @ 4 CORES | 130 W |
| CORE i7-4930K | IVY BRIDGE-E (22 nm) | 3.4 GHz @ 6 CORES | 130 W |
| CORE i7-4960X EXTREME EDITION | IVY BRIDGE-E (22 nm) | 3.6 GHz @ 6 CORES | 130 W |
| CORE i7-5820K | HASWELL-E (22 nm) | 3.3 GHz @ 6 CORES | 140 W |
| CORE i7-5930K | HASWELL-E (22 nm) | 3.5 GHz @ 6 CORES | 140 W |
| CORE i7-5960X EXTREME EDITION | HASWELL-E (22 nm) | 3.0 GHz @ 8 CORES | 140 W |
| CORE i7-6700T | SKYLAKE (14 nm) | 2.8 GHz @ 4 CORES | 35 W |
| CORE i7-6700 | SKYLAKE (14 nm) | 3.4 GHz @ 4 CORES | 65 W |
| CORE i7-6700K | SKYLAKE (14 nm) | 4.0 GHz @ 4 CORES | 91 W |
| CORE i7-6785R | SKYLAKE (14 nm) | 3.3 GHz @ 4 CORES | 65 W |
| CORE i7-6800K | BROADWELL-E (14 nm) | 3.4 GHz @ 6 CORES | 140 W |
| CORE i7-6850K | BROADWELL-E (14 nm) | 3.6 GHz @ 6 CORES | 140 W |
| CORE i7-6900K | BROADWELL-E (14 nm) | 3.2 GHz @ 8 CORES | 140 W |
| CORE i7-6950X | BROADWELL-E (14 nm) | 3.0 GHz @ 10 CORES | 140 W |
| CORE i7 7700 | KABY LAKE (14 nm) | 3.6 GHz @ 4 CORES | 65 W |
| CORE i7 7700K | KABY LAKE (14 nm) | 4.2 GHz @ 4 CORES | 91 W |
| CORE i7 8700K | COFFEE LAKE (14 nm) | 4.7 GHz @ 6 CORES | 95 W |

| HEAT TRANSFER COEFFICIENT TABLE | |
|---|---|
| MATERIAL | HEAT TRANSFER COEFFICIENT |
| MATERIAL A | $C_0$ |
| MATERIAL B | $C_1$ |
| MATERIAL C | $C_2$ |
| MATERIAL D | $C_3$ |
| MATERIAL E | $C_4$ |
| MATERIAL F | $C_5$ |
| MATERIAL G | $C_6$ |

| THERMAL COEFFICIENT OF POWER TABLE | |
|---|---|
| MATERIAL | THERMAL COEFFICIENT OF POWER |
| MATERIAL A | $TC_0$ |
| MATERIAL B | $TC_1$ |
| MATERIAL C | $TC_2$ |
| MATERIAL D | $TC_3$ |
| MATERIAL E | $TC_4$ |
| MATERIAL F | $TC_5$ |
| MATERIAL G | $TC_6$ |

FIG. 12B

METHODS AND APPARATUS TO ADJUST ENERGY REQUIREMENTS IN A DATA CENTER

FIELD OF THE DISCLOSURE

The present disclosure relates generally to data centers and, more particularly, to methods and apparatus to adjust energy requirements in a data center.

BACKGROUND

Virtualizing computer systems provides benefits such as the ability to execute multiple computer systems on a single hardware computer, replicating computer systems, moving computer systems among multiple hardware computers, and so forth. "Infrastructure-as-a-Service" (also commonly referred to as "IaaS") generally describes a suite of technologies provided by a service provider as an integrated solution to allow for elastic creation of a virtualized, networked, and pooled computing platform (sometimes referred to as a "cloud computing platform"). Enterprises may use IaaS as a business-internal organizational cloud computing platform (sometimes referred to as a "private cloud") that gives an application developer access to infrastructure resources, such as virtualized servers, storage, and networking resources. By providing ready access to the hardware resources required to run an application, the cloud computing platform enables developers to build, deploy, and manage the lifecycle of a web application (or any other type of networked application) at a greater scale and at a faster pace than ever before.

Cloud computing environments may be composed of many processing units (e.g., servers). The processing units may be installed in standardized frames, known as racks, which provide efficient use of floor space by allowing the processing units to be stacked vertically. The racks may additionally include other components of a cloud computing environment such as storage devices, networking devices (e.g., switches), etc. Hardware resources for cloud computing systems are often installed in large facilities known as data center. The processing units and other components generate a significant amount of heat, requiring a significant amount of energy to cool. Additionally, the processing units and other components require a significant amount of energy to operate.

BRIEF DESCRIPTION OF THE DRAWINGS

FIG. 6 is example pseudo code representative of machine readable instructions that may be executed by one or more processors of the resource utilization manager of FIG. 1 to optimize energy requirements in a data center in accordance with teachings of this disclosure.

FIGS. 11A and 11B depict example power usage tables for example central processing units.

FIGS. 12A and 12B depict example material coefficient tables that may be utilized to determine heat generated by a data center.

Figure 1:
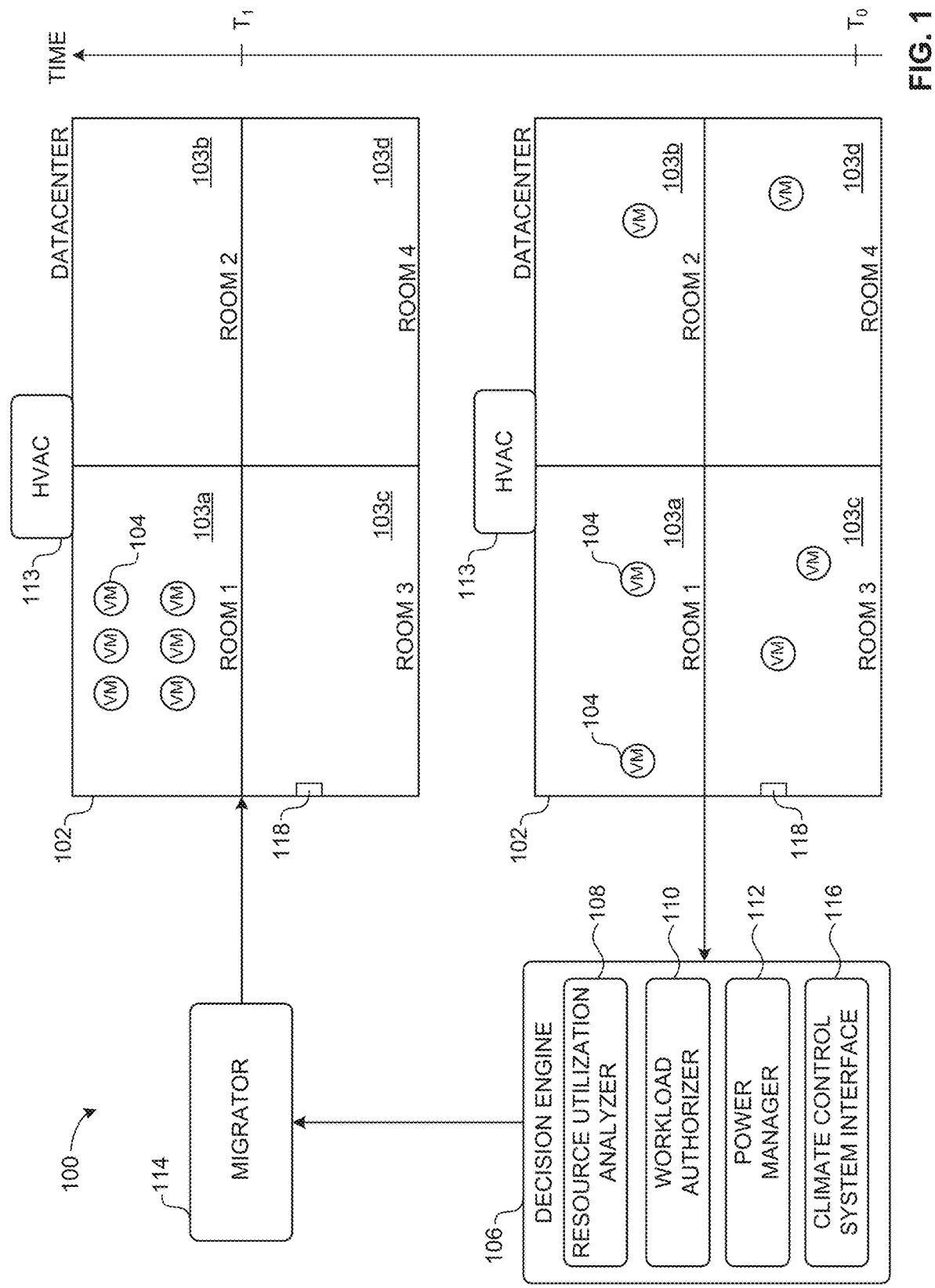
FIG. 1 is an example resource utilization manager to optimize energy requirements in a data center in accordance with teachings of this disclosure.

Wherever possible, the same reference numbers are used throughout the drawing(s) and accompanying written description to refer to the same or like parts. Connecting lines or connectors shown in the various figures presented are intended to represent example functional relationships and/or physical or logical couplings between the various elements.

DETAILED DESCRIPTION

Cloud computing is based on the deployment of many physical resources across a network, virtualizing the physical resources into virtual resources, and provisioning the virtual resources in software defined data centers (SDDCs) for use across cloud computing services and applications. Examples disclosed herein may be used to manage network resources in SDDCs to improve performance and efficiencies of network communications between different virtual and/or physical resources of the SDDCs.

Examples disclosed herein employ with system-level governing features that can actively monitor and manage different hardware and software components of a virtual server rack system even when such different hardware and software components execute different OSs. As described in connection with FIG. 3, major components of a virtual server rack system include a hypervisor, network virtualization software, storage virtualization software (e.g., software-defined data storage), a physical network OS, and external storage. In some examples, the virtual server rack system includes a decision engine, a climate controller, and/or a power predictor which monitor hardware resources of physical server racks, monitor climate control systems, and migrate workloads to more efficiently utilize the climate control systems for cooling operations of a data center facility.

Physical hardware systems of a data center require a significant amount of energy to operate. For example, as physical racks 202, 204 of FIG. 2 provision their hardware resources to execute workloads, power requirements to operate the physical racks 202, 204 can increase/decrease depending on workload profiles. In some examples, a manager of a data center may negotiate with an electric power provider on future power supply levels to operate hardware resources in a data center. However, inaccurately providing lower or higher power supply levels than actually used can be costly to a data center operator. Further, the physical racks 202, 204 produce heat at varying rates depending on the workload profiles. As such, there are also power requirements for running a climate control system that cools the hardware resources to prevent thermal failure or decreased performance from overheating of the hardware resources. However, like the power requirements to operate the hardware resources, the power requirements to cool the hardware resources may be inaccurate and become costly to a data center operator. In some examples, the physical racks 202, 204 may be located in different rooms of a data center. As such, if both physical racks 202, 204 are provisioned to balance the workload profiles, the data center is wasting power resources to operate and cool two rooms (e.g., room one for the physical rack 202, and room two for the physical rack 204).

Examples disclosed herein may be used to significantly lower costs associated with cooling operations of a data center by consolidating workload operations to fewer physical spaces or fewer server rooms of the data center during times of lower demand for resources. In this manner, cooling operations can be relaxed in non-utilized or less-utilized server rooms or spaces. Examples disclosed herein are also useful for more accurately predicting future energy requirements by maintaining ambient operating temperatures of the server rooms at sufficiently cool temperatures to prevent overheating of hardware resources and to provide hardware resources with operating environment temperatures that will promote high computing performance.

Example methods, apparatus and articles of manufacture disclosed herein optimize energy usage in data centers. In recent years, there has been a big push in the construction industry to make buildings more energy efficient. For example, LEED has been the industry leader in focusing on making buildings more "green" and sustainable by saving energy and resources. When a building qualifies under LEED standards, the building is awarded a LEED certification. As such, in some examples, examples disclosed herein may be used to make data center facilities LEED certified by reducing overall energy consumption of running a data center. Examples disclosed herein lower costs associated with cooling operations of a data center by consolidating workload operations to fewer physical spaces or fewer server rooms of the data center during times of lower demand for resources. As such, cooling operations can be relaxed in non-utilized or less-utilized server rooms or spaces. Further, examples disclosed herein more accurately predict future energy requirements by maintaining ambient operating temperatures of the server rooms at sufficiently cool temperatures to prevent overheating of hardware resources and to provide hardware resources with operating environment temperatures that will promote high computing performance.

Examples disclosed herein mitigate problems associated with cooling multiple spaces in a data center and running multiple hardware resources in the data center. For example, examples disclosed herein reduce inefficiencies related to identifying future power needs such as 1) ordering too much power for such future needs leading to unnecessarily spent capital, and 2) ordering too little power leading to paying significantly increased prices to order instant on-demand power as needed for unforeseen spikes and excess energy needs. Additionally, examples disclosed herein reduce overly high temperatures known to adversely affect electrical properties of semiconductors which, in turn, increases CPU computational performance, reduces computational errors, increases memory and/or storage integrity, and mitigates hardware resource failures.

FIG. 1 illustrates an example resource utilization manager 100 to optimize energy requirements in an example data center 102 in accordance with teachings of this disclosure. In the illustrated example, the data center 102 is representative of a building structure or building facility that includes multiple physical server racks (not shown) across four rooms 103a-d within the data center 102 to execute virtual computing resources such as virtual machines 104. The example resource utilization manager 100 includes a decision engine 106 to analyze resource utilization information to optimize energy requirements of the data center 102. In the illustrated example, the example decision engine 106 includes an example resource utilization analyzer 108, an example workload authorizer 110, an example power manager 112, and an example climate control system interface 116.

In the illustrated example of FIG. 1, the data center 102 is shown at two instants in time represented as a first time (T0) and a second time (T1). At the first time (T0), the resource utilization analyzer 108 analyzes resource usage information collected from the physical server racks on which the virtual machines 104 are operating. For example, the resource utilization analyzer 108 may receive configuration files from a virtual rack manager (e.g., virtual rack manager 225, 227 of FIG. 2) that identifies which physical hardware components (e.g., physical hardware components 224, 226 of FIG. 2) are operating virtual machines 104. The resource utilization analyzer 108 may analyze the configuration files to determine resource utilization information indicative of physical resource usage of physical server racks. For example, the resource utilization analyzer 108 may determine that: 1) one or more physical server racks in room 103a is/are operating at a combined 10% resource utilization to run the virtual machines 104, 2) one or more physical server racks in room 103b is/are operating at a combined 5% resource utilization to run the virtual machine 104, 3) one or more physical server racks in room 103c is/are operating at a combined 10% resource utilization to run the virtual machines 104, and 4) one or more physical server rack in room 103d is/are operating at a combined 5% resource utilization to run the virtual machines 104. In some examples, the resource utilization analyzer 108 determines the resource utilization information based on the configuration files to determine a total quantity of hardware resources (e.g., a number of server hosts) utilized and/or multiple total quantities of different types of hardware resources utilized (e.g., total CPUs, total network interface cards, total data store components, total memory components, total graphics processing units (GPUs), etc.). Such determining of total quantities of hardware resources is useful in instances in which different server rooms include different numbers of hardware resources (e.g., different quantities of physical server racks, different quantities of hosts, etc.) such that a resource utilization percentage for one room may mean a different number of hardware resources than the same resource utilization percentage for another room. For example, room 103a may contain 100 physical server racks, while room 103b contains 1000 physical server racks. As such, the resource utilization percentages for rooms 103a, 103b do not correspond to the same quantity of physical hardware resources. As such, the resource utilization analyzer 108 determines the amount of physical hardware resources available in one or more rooms 103a-d to take on more workloads based on the rooms 103a-d capacity of physical hardware resources. In yet other examples, resource utilization percentages alone may be sufficient when the same number of hardware resources are located in each room 103a-d such that a resource utilization percentage corresponds to the same number of hardware resources for any of the rooms 103a-d. In such examples, the percentage resource utilizations can be compared across server racks having substantially the same hardware configurations (e.g., each physical server rack includes 24 physical server hosts). In any case, in addition to determining resources utilized, the resource utilization analyzer 108 also determines the quantity or amount of available/free resources in the server rooms 103a-d to determine the number of workloads or VMs that can be migrated to and executed in each room 103a-d. The resource utilization analyzer 108 forwards this information to the workload authorizer 110 for further processing.

The example workload authorizer 110 determines an amount of heat generated by a physical rack based on the resource utilization information from the resource utilization analyzer 108. For example, the workload authorizer 110 determines an amount of heat generated by a physical server rack based on the resource utilization information, and compares the amount of heat to a threshold amount of heat. In some examples, the workload authorizer 110 determines the amount of heat by utilizing example tables illustrated in FIGS. 11A, 11B, 12A and 12B and discussed in detail below. As such, the workload authorizer 110 determines which virtual machines 104 to migrate between different rooms to reduce the amount of heat generated by the physical server racks in one or more of the server rooms. For example, the workload authorizer 110 identifies that all virtual machines 104 are to migrate to room 103a, and the other rooms 103b-d are to be placed in a low-power state to reduce heat generation. Low-power state may include, but is not limited to, shutting down one or more hosts in a server room, placing all physical server racks in an idle mode, migrating VM's off of a server rack until the server rack reaches a lower percentage resource utilization measurement (e.g., 10% resource utilization, 20% resource utilization), etc. In some examples, the workload authorizer 110 identifies that each physical server rack operating in each of the rooms 103a-d can be optimized (e.g., has capacity to execute more workloads or can offload VM's to be placed in a low-power state).

The example power manager 112 generates a migration plan identifying the virtual machines 104 in rooms 103b-d to be migrated to room 103a. The power manager 112 also provides a temperature control signal to instruct a climate control system (e.g., a heating, ventilation, and air conditioning (HVAC) system) 113 to decrease a power utilization to cool the rooms 103b-d following the migration in the migration plan. The power manager 112 generates the temperature control signal to be identifiable by the climate control system 113 receiving the temperature control signal. For example, the power manager 112 generates the migration plan so a migrator 114 can identify and execute the temperature control signal, and a climate control system 113 can identify and execute the temperature control signal. In some examples, the temperature control signal is a temperature set point for a thermostat such that the temperature set point can be raised for a room that requires less cooling. In other examples, the temperature control signal is an on/off signal to power on or off the climate control system 113 in a room. In other examples, the temperature control signal is a climate control mode signal (e.g., high cooling mode, moderate cooling mode, low cooling mode, daytime cooling mode, nighttime cooling mode, etc.).

The climate control system interface 116 of the illustrated example sends the temperature control signal to the climate control system 113 of the data center 102. The temperature control signal is representative of an adjustment to a cooling process of the climate control system 113 based on the physical server racks of rooms 103b-d being in a low-power state. For example, a power manager may place the physical server racks of rooms 103b-d in a low-power state based on the migration of the virtual machines 104 from rooms 103b-d to room 103a, which allows the temperature control signal to adjust the cooling process. In some examples, the climate control interface 116 interacts with the climate control system 113 to determine a temperature. For example, the climate control system 113 may be equipped with an internal temperature sensing system, which the climate control interface 116 can utilize to determine a temperature of a server room 103a-d. In some examples, the climate control system 113 utilizes thermocouples 118 distributed in the data center 102 to determine when a desired temperature has been reached. While one thermocouple 118 is illustrated in FIG. 1 any number of thermocouples may be distributed in the data center 102.

At time (T1), the migrator 114 migrates the virtual machines 104 of rooms 103b-d to room 103a based on the processes carried out by the decision engine 106. As such, the physical server racks in rooms 103b-d are no longer executing any workloads and can be placed in a low-power mode to reduce the amount of power required to cool the physical server racks in rooms 103b-d. In some examples, the number of workloads in rooms 103b-d are only decreased (e.g., if there is not sufficient resource capacity in room 103a to execute all workloads), but such decreasing of workloads still allows decreasing power consumption needed to cool rooms 103b-d due to fewer hardware resources generating heat.

Figure 2:
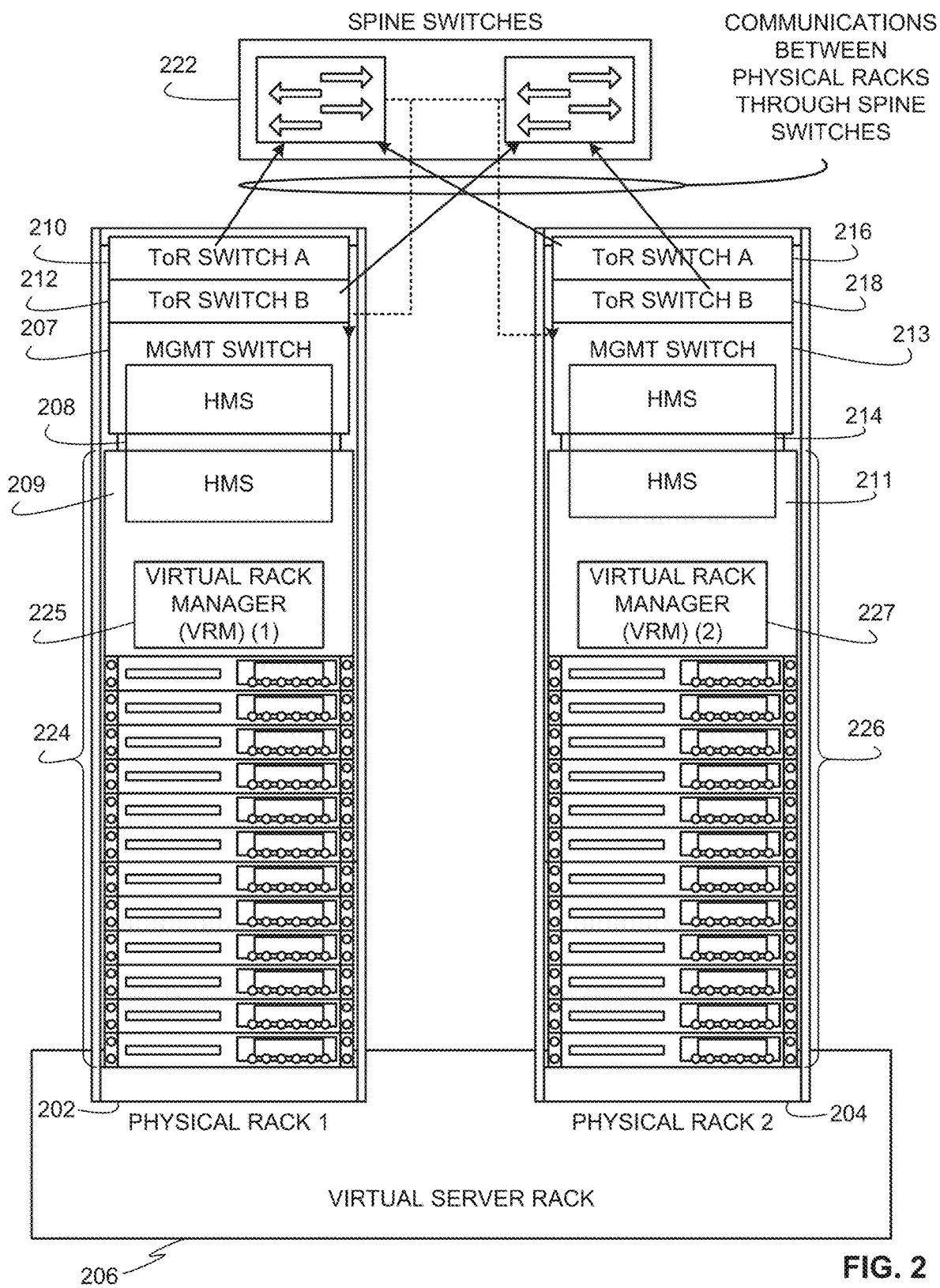
FIG. 2 depicts example physical racks in an example virtual server rack deployment.

FIG. 2 depicts example physical racks 202, 204 in an example deployment of a virtual server rack 206. Example components of the physical server racks 202, 204 and the virtual server rack 206 to facilitate migrating and instantiating VM's to manage power usage and climate control operations in accordance with teachings of this disclosure are described below. The virtual server rack 206 of the illustrated example enables representing hardware resources (e.g., physical hardware resources 224, 226) as logical/virtual resources. In the illustrated example, the virtual server rack 206 is instantiated across the physical server racks 202, 204 including hardware such as server nodes (e.g., compute+storage+network links), network switches, and, optionally, separate storage units. From a user perspective, the example virtual server rack 206 is an aggregated pool of logic resources exposed as one or more VMWARE ESXI™ clusters along with a logical storage pool and network connectivity. In examples disclosed herein, a cluster is a server group in a virtual environment. For example, a VMWARE ESXI™ cluster is a group of physical servers in the physical hardware resources that run VMWARE ESXI™ hypervisors to virtualize processor, memory, storage, and networking resources into logical resources to run multiple VMs that run OSs and applications as if those OSs and applications were running on physical hardware without an intermediate virtualization layer.

In the illustrated example, the first physical rack 202 has an example ToR switch A 210, an example ToR switch B 212, an example management switch 207, and an example server host node(0) 209. In the illustrated example, the management switch 207 and the server host node(0) 209 run a hardware management system (HMS) 208 for the first physical rack 202. The second physical rack 204 of the illustrated example is also provided with an example ToR switch A 216, an example ToR switch B 218, an example management switch 213, and an example server host node (0) 211. In the illustrated example, the management switch 213 and the server host node (0) 211 run an HMS 214 for the second physical rack 204.

In the illustrated example, the HMS 208, 214 connects to server management ports of the server host node(0) 209, 211 (e.g., using a baseboard management controller (BMC)), connects to ToR switch management ports (e.g., using 1 gigabits per second (Gbps) links) of the ToR switches 210, 212, 216, 218, and also connects to spine switch management ports of one or more spine switches 222. In the illustrated example, the ToR switches 210, 212, 216, 218, implement leaf switches such that the ToR switches 210, 212, 216, 218, and the spine switches 222 are in communication with one another in a leaf-spine switch configuration. These example connections form a non-routable private Internet protocol (IP) management network for out-of-band (OOB) management. The HMS 208, 214 of the illustrated example uses this OOB management interface to the server management ports of the server host node(0) 209, 211 for server hardware management. In addition, the HMS 208, 214 of the illustrated example uses this OOB management interface to the ToR switch management ports of the ToR switches 210, 212, 216, 218 and to the spine switch management ports of the one or more spine switches 222 for switch management. In examples disclosed herein, the ToR switches 210, 212, 216, 218 connect to server NIC ports (e.g., using 10 Gbps links) of server hosts in the physical racks 202, 204 for downlink communications and to the spine switch(es) 222 (e.g., using 40 Gbps links) for uplink communications. In the illustrated example, the management switch 207, 213 is also connected to the ToR switches 210, 212, 216, 218 (e.g., using a 10 Gbps link) for internal communications between the management switch 207, 213 and the ToR switches 210, 212, 216, 218. Also in the illustrated example, the HMS 208, 214 is provided with in-band (IB) connectivity to individual server nodes (e.g., server nodes in example physical hardware resources 224, 226) of the physical rack 202, 204. In the illustrated example, the IB connection interfaces to physical hardware resources 224, 226 via an OS running on the server nodes using an OS-specific application programming interface (API) such as VMWARE VSPHERE® API, command line interface (CLI), and/or interfaces such as Common Information Model from Distributed Management Task Force (DMTF).

Example OOB operations performed by the HMS 208, 214 include discovery of new hardware, bootstrapping, remote power control, authentication, hard resetting of non-responsive hosts, monitoring catastrophic hardware failures, and firmware upgrades. The example HMS 208, 214 uses IB management to periodically monitor status and health of the physical resources 224, 226 and to keep server objects and switch objects up to date. Example IB operations performed by the HMS 208, 214 include controlling power state, accessing temperature sensors, controlling Basic Input/Output System (BIOS) inventory of hardware (e.g., central processing units (CPUs), memory, disks, etc.), event monitoring, and logging events.

The HMSs 208, 214 of the corresponding physical racks 202, 204 interface with virtual rack managers (VRMs) 225, 227 of the corresponding physical racks 202, 204 to instantiate and manage the virtual server rack 206 using physical hardware resources 224, 226 (e.g., processors, NICs, servers, switches, storage devices, peripherals, power supplies, etc.) of the physical racks 202, 204. In the illustrated example, the VRM 225 of the first physical rack 202 runs on a cluster of three server host nodes of the first physical rack 202, one of which is the server host node(0) 209. In some examples, the term "host" refers to a functionally indivisible unit of the physical hardware resources 224, 226, such as a physical server that is configured or allocated, as a whole, to a virtual rack and/or workload; powered on or off in its entirety; or may otherwise be considered a complete functional unit. Also in the illustrated example, the VRM 227 of the second physical rack 204 runs on a cluster of three server host nodes of the second physical rack 204, one of which is the server host node(0) 211. In the illustrated example, the VRMs 225, 227 of the corresponding physical racks 202, 204 communicate with each other through one or more spine switches 222. Also in the illustrated example, communications between physical hardware resources 224, 226 of the physical racks 202, 204 are exchanged between the ToR switches 210, 212, 216, 218 of the physical racks 202, 204 through the one or more spine switches 222. In the illustrated example, each of the ToR switches 210, 212, 216, 218 is connected to each of two spine switches 222. In other examples, fewer or more spine switches may be used. For example, additional spine switches may be added when physical racks are added to the virtual server rack 206. In some examples disclosed herein, spine switches are also used to interconnect physical racks and their hardware resources across different server rooms (e.g., the rooms 103a-d of FIG. 1). Migrating VMs between physical racks across different rooms can be done via the spine switches.

In examples disclosed herein, a CLI and/or APIs are used to manage the ToR switches 210, 212, 216, 218. For example, the HMS 208, 214 uses CLI/APIs to populate switch objects corresponding to the ToR switches 210, 212, 216, 218. On HMS bootup, the HMS 208, 214 populates initial switch objects with statically available information. In addition, the HMS 208, 214 uses a periodic polling mechanism as part of an HMS switch management application thread to collect statistical and health data from the ToR switches 210, 212, 216, 218 (e.g., Link states, Packet Stats, Availability, etc.). There is also a configuration buffer as part of the switch object which stores the configuration information to be applied on the switch.

The HMS 208, 214 of the illustrated example of FIG. 2 is a stateless software agent responsible for managing individual hardware resources in a physical rack 202, 204. Examples of hardware elements that the HMS 208, 214 manages are servers and network switches in the physical rack 202, 204. In the illustrated example, the HMS 208, 214 is implemented using Java on Linux so that an OOB management portion of the HMS 208, 214 runs as a Java application on a white box management switch (e.g., the management switch 207, 213) in the physical rack 202, 204. However, any other programming language and any other OS may be used to implement the HMS 208, 214.

Figure 3:
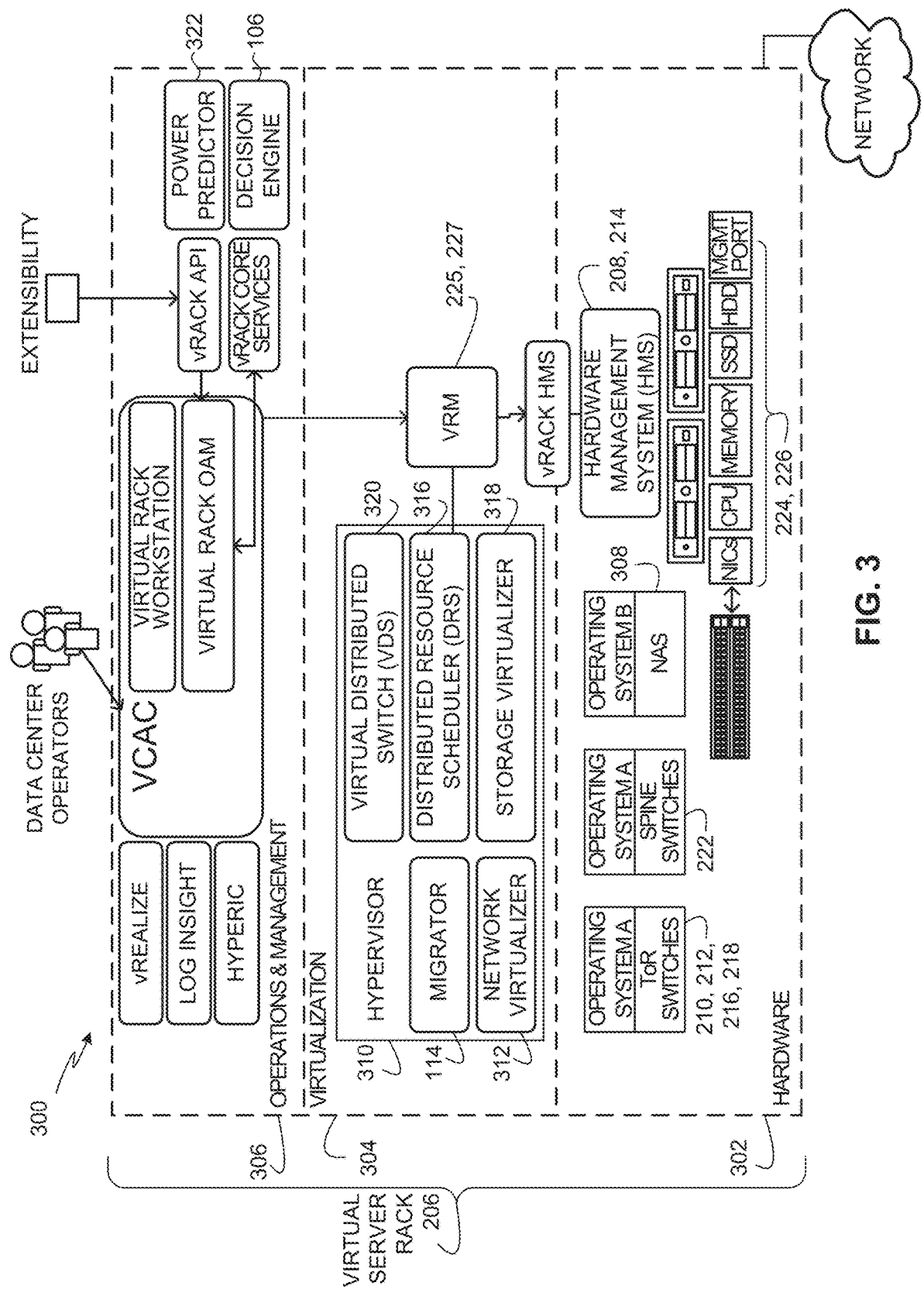
FIG. 3 depicts an example architecture to configure and deploy the example virtual server rack of FIG. 2.

FIG. 3 depicts an example virtual server rack architecture 300 that may be used to configure and deploy the virtual server rack 206 of FIG. 2. The example architecture 300 of FIG. 3 includes a hardware layer 302, a virtualization layer 304, and an operations and management layer (OAM) 306. In the illustrated example, the hardware layer 302, the virtualization layer 304, and the OAM layer 306 are part of the example virtual server rack 206 of FIG. 2. The virtual server rack 206 of the illustrated example is based on the physical racks 202, 204 of FIG. 2. The example virtual server rack 206 configures the physical hardware resources 224, 226, virtualizes the physical hardware resources 224, 226 into virtual resources, provisions virtual resources for use in providing cloud-based services, and maintains the physical hardware resources 224, 226 and the virtual resources.

The example hardware layer 302 of FIG. 3 includes the HMS 208, 214 of FIG. 2 that interfaces with the physical hardware resources 224, 226 (e.g., processors, NICs, servers, switches, storage devices, peripherals, power supplies, etc.), the ToR switches 210, 212, 216, 218 of FIG. 2, the spine switches 222 of FIG. 2, and network attached storage (NAS) hardware 308. The HMS 208, 214 is configured to manage individual hardware nodes such as different ones of the physical hardware resources 224, 226. For example, managing of the hardware nodes involves discovering nodes, bootstrapping nodes, resetting nodes, powering down nodes, processing hardware events (e.g., alarms, sensor data threshold triggers) and state changes, exposing hardware events and state changes to other resources and a stack of the virtual server rack 206 in a hardware-independent manner. The HMS 208, 214 also supports rack-level boot-up sequencing of the physical hardware resources 224, 226 and provides services such as secure resets, remote resets, and/or hard resets of the physical hardware resources 224, 226.

The example virtualization layer 304 includes the VRM 225, 227. The example VRM 225, 227 communicates with the HMS 208, 214 to manage the physical hardware resources 224, 226. The example VRM 225, 227 creates the example virtual server rack 206 out of underlying physical hardware resources 224, 226 that may span one or more physical racks (or smaller units such as a hyper-appliance or half rack) and handles physical management of those resources. The example VRM 225, 227 uses the virtual server rack 206 as a basis of aggregation to create and provide operational views, handle fault domains, and scale to accommodate workload profiles. The example VRM 225, 227 keeps track of available capacity in the virtual server rack 206, maintains a view of a logical pool of virtual resources throughout the SDDC life-cycle, and translates logical resource provisioning to allocation of physical hardware resources 224, 226. The example VRM 225, 227 interfaces with an example hypervisor 310 of the virtualization layer 304. The example hypervisor 310 is installed and runs on server hosts in the example physical resources 224, 226 to enable the server hosts to be partitioned into multiple logical servers to create VMs. In some examples, the hypervisor 310 may be implemented using a VMWARE ESXI™ hypervisor available as a component of a VMWARE VSPHERE® virtualization suite developed and provided by VMware, Inc. The VMWARE VSPHERE® virtualization suite is a collection of components to setup and manage a virtual infrastructure of servers, networks, and other resources In the illustrated example of FIG. 3, the hypervisor 310 is shown having a number of virtualization components executing thereon including an example network virtualizer 312, an example migrator 114, an example distributed resource scheduler (DRS) 316, an example storage virtualizer 318, and an example virtual distributed switch (VDS) 320. In the illustrated example, the VRM 225, 227 communicates with these components to manage and present the logical view of underlying resources such as hosts and clusters. The example VRM 225, 227 also uses the logical view for orchestration and provisioning of workloads.

The example network virtualizer 312 virtualizes network resources such as physical hardware switches (e.g., the management switches 207, 213 of FIG. 2, the ToR switches 210, 212, 216, 218, and/or the spine switches 222) to provide software-based virtual networks. The example network virtualizer 312 enables treating physical network resources (e.g., switches) as a pool of transport capacity. In some examples, the network virtualizer 312 also provides network and security services to VMs with a policy driven approach. The network virtualizer 312 includes a number of components to deploy and manage virtualized network resources across servers, switches, and clients. For example, the network virtualizer 312 includes a network virtualization manager that functions as a centralized management component of the network virtualizer 312 and runs as a virtual appliance on a server host. In some examples, the network virtualizer 312 may be implemented using a VMWARE NSX™ network virtualization platform that includes a number of components including a VMWARE NSX™ network virtualization manager.

The example migrator 114 is provided to move or migrate VMs between different hosts without losing state during such migrations. For example, the migrator 114 allows moving an entire running VM from one physical server host to another physical server host in the same physical rack or in another physical rack with substantially little or no downtime. The migrating VM retains its network identity and connections, which results in a substantially seamless migration process. To perform a VM migration, the example migrator 114 transfers the VM's active memory and precise execution state over a high-speed network, which allows the VM to switch from running on a source server host to running on a destination server host.

The example DRS 316 is provided to monitor resource utilization across resource pools, to manage resource allocations to different VMs, to deploy additional storage capacity to VM clusters with substantially little or no service disruptions, and to work with the migrator 114 to automatically migrate VMs during maintenance with substantially little or no service disruptions.

The example storage virtualizer 318 is software-defined storage for use in connection with virtualized environments. The example storage virtualizer 318 clusters server-attached hard disk drives (HDDs) and solid state drives (SSDs) to create a shared datastore for use as virtual storage resources in virtual environments. In some examples, the storage virtualizer 318 may be implemented using a VMWARE® VIRTUAL SAN™ network data storage virtualization component developed and provided by VMware, Inc.

Figure 4:
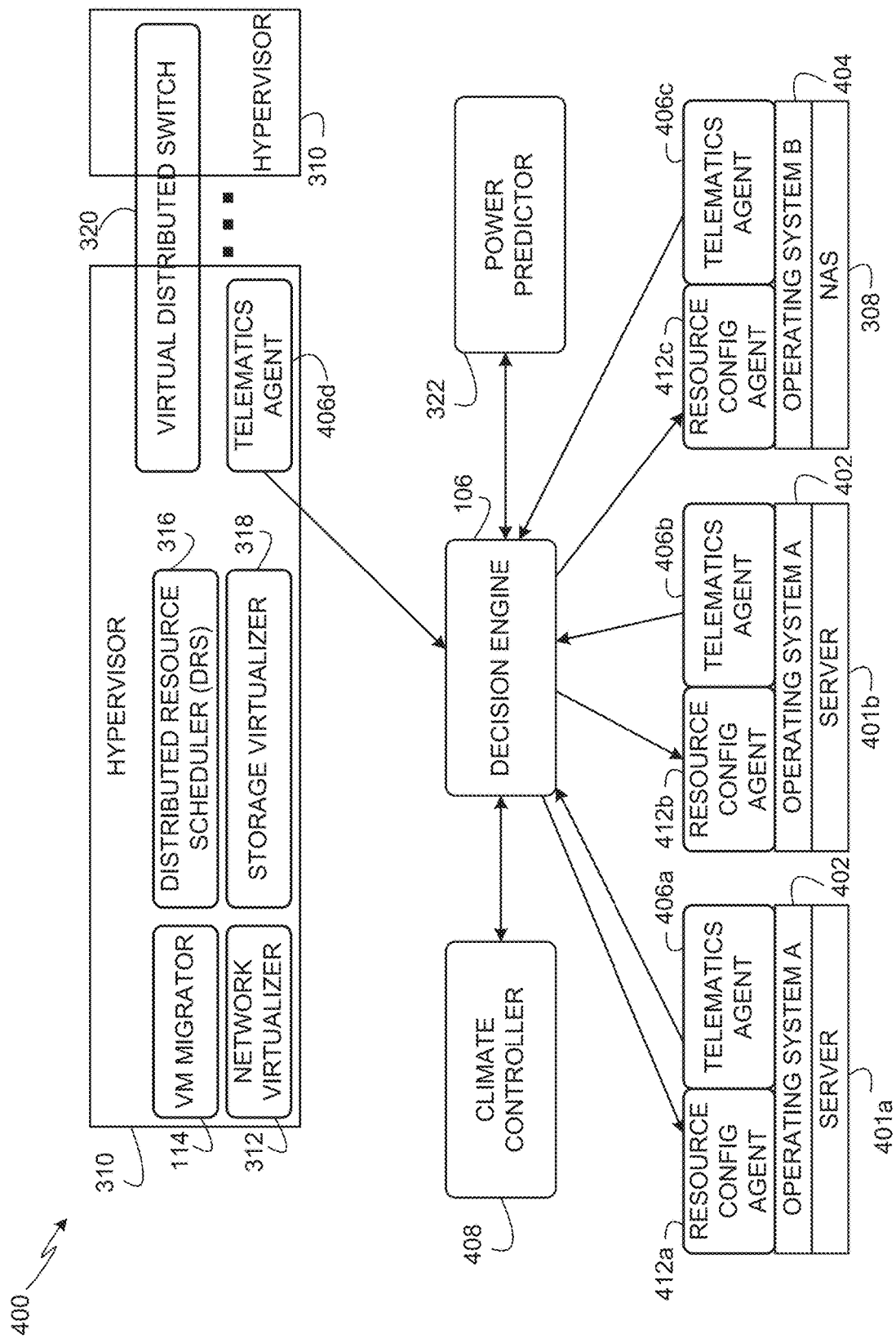
FIG. 4 depicts an example virtual cloud management system that may be used to implement examples disclosed herein.

The example VDS 320 implements software-defined networks for use in connection with virtualized environments in the form of a networking module for the hypervisor 310. In some examples, the VDS 320 is distributed across multiple hosts having separate instances of the hypervisor 310, as shown in FIG. 4.

The virtualization layer 304 of the illustrated example, and its associated components are configured to run VMs. However, in other examples, the virtualization layer 304 may additionally, and/or alternatively, be configured to run containers. For example, the virtualization layer 304 may be used to deploy a VM as a data computer node with its own guest OS on a host using resources of the host. Additionally, and/or alternatively, the virtualization layer 304 may be used to deploy a container as a data computer node that runs on top of a host OS without the need for a hypervisor or separate OS. Thus, although some examples disclosed herein are described in connection with migrating VMs between physical server racks, examples disclosed herein may additionally or alternatively be employed to migrate containers between physical server racks to more efficiently use electrical power in a data center. For example, the migrator 114 may be adopted to migrate containers and/or VMs.

In the illustrated example, the OAM layer 306 is an extension of a VMWARE VCLOUD® AUTOMATION CENTER™ (VCAC) that relies on the VCAC functionality and also leverages utilities such as VMWARE VCENTER™ Log Insight™, and VMWARE VCENTER™ HYPERIC® to deliver a single point of SDDC operations and management. The example OAM layer 306 is configured to provide different services such as health monitoring service, capacity planner service, maintenance planner service, events and operational view service, and virtual rack application workloads manager service. The example OAM layer 306 includes the example decision engine 106 of FIG. 1 and a power predictor 322 illustrated in FIG. 10.

Example components of FIG. 3 may be implemented using products developed and provided by VMware, Inc. Alternatively, some or all of such components may alternatively be supplied by components with the same and/or similar features developed and/or provided by other virtualization component developers.

FIG. 4 depicts an example virtual cloud management system 400 that may be used to collect resource utilization information from hardware resources across multiple physical racks. For example, the resource utilization information can be used to determine when VM migrations between server rooms can be performed to reduce cooling system activities in server rooms running no workloads or fewer workloads relative to other server rooms. The example virtual cloud management system 400 includes the example network virtualizer 312, the example migrator 114, the example DRS 316, the example storage virtualizer 318, and the example VDS 320 of FIG. 3.

In the illustrated example, the virtual cloud management system 400 is implemented using a SDDC deployment and management platform such as the VMware Cloud Foundation (VCF) platform developed and provided by VMware, Inc. The example virtual cloud management system 400 manages different parameters of the ToR switches 210, 212, 216, 218, the spine switches 222, and the NAS 308. The example virtual cloud management system 400 commands different components even when such components run different OSs. For example, server nodes 401a, 401b run OS A 402, and the NAS 308 runs OS B 404. In the illustrated example, the OS A 402 and the OS B 404 are different types of OSs. For example, the OS A 402 and the OS B 404 may be developed by different companies, may be developed for different hardware, may be developed for different functionality, may include different kernels, and/or may be different in other ways. In some examples, the OS A 402 may be implemented using a Linux-based OS, and the OS B 404 may be implemented using an EMC NAS OS (developed and provided by EMC Corporation) that runs on network attached storage devices. In the illustrated example of FIG. 4, OS A 402 and OS B 404 are unaware of the events occurring in the hypervisor 310. However, examples disclosed herein enable monitoring different OSs across physical resources at a system level to collect resource utilization information across servers and across physical server racks. The servers 401a, b and the NAS 308 of the illustrated example may be located in the same physical server rack or across multiple physical server racks.

The example virtual cloud management system 400 includes example telematics agents 406a-d, an example climate controller 408, the example decision engine 106, the example power predictor 322, and example resource configuration agents 412a, 412b and 412c. In the illustrated example, the telematics agents 406a-d are provided to collect resource utilization information from different hardware resources and provide the resource utilization information to the example decision engine 106. In the illustrated example, the telematics agents 406a-d are provided as add-on modules installable and executable on the different components. For example, the telematics agent 406a is installed and executed on the OS A 402 of the server node 401a, the example telematics agent 406b is installed and executed on the OS A 402 of the server node 401b, the example telematics agent 406c is installed and executed on the OS B 404 of the NAS 308, and the example telematics agent 406d is installed and executed on the hypervisor 310. In the illustrated example, the telematics agents 406a-d run on respective components while creating substantially little or no interference to the OSs of those components. For example, the telematics agents 406a-d may be implemented as a set of Access Control List (ACL) rules that operate as data collection rules to capture signatures of events that are happening in the virtual cloud management system 400. Such data collection rules can include static rules and/or dynamic rules. Example data collection rules can be used to collect statistics for quantities of VMs that are currently active, quantities of VMs that are scheduled to be active in a future duration, present and future scheduled workloads, etc. The example telematics engines 406a-d collect such resource utilization information periodically and send the resource utilization information to the example decision engine 106 for analysis to identify subsequent responsive actions based on such resource utilization information.

In some examples, the example telematics engines 406a-d are used to implement the example decision engine 106 of FIG. 1. In such examples, the telematics engines 406a-d are configured to detect when workloads executed on the physical server racks are below a resource utilization threshold. Additionally, and/or alternatively, the example telematics engines 406a-d detect changes in the physical server racks.

The example climate controller 408 operates the climate control system 113 of the data center (e.g., the data center 102 of FIG. 1). For example, the climate controller 408 monitors and adjusts cooling conditions within the server rooms 103a-d of the data center 102 to mitigate overheating of hardware resources in physical server racks. The example climate controller 408 is in communication with the decision engine 106 and the power predictor 322 to improve the efficiency of energy use for running the data center 102 and, thus, reduce the overall energy consumption of the data center 102. For example, the climate control system 113 may receive temperature control signals from the decision engine 106 to adjust the cooling conditions in a server room 103a-d of the data center 102. In other examples, the climate controller 408 receives power utilization information from the power predictor 322 that identifies how much power to utilize at a future time to cool a server room 103a-d during a future duration.

Figure 5:
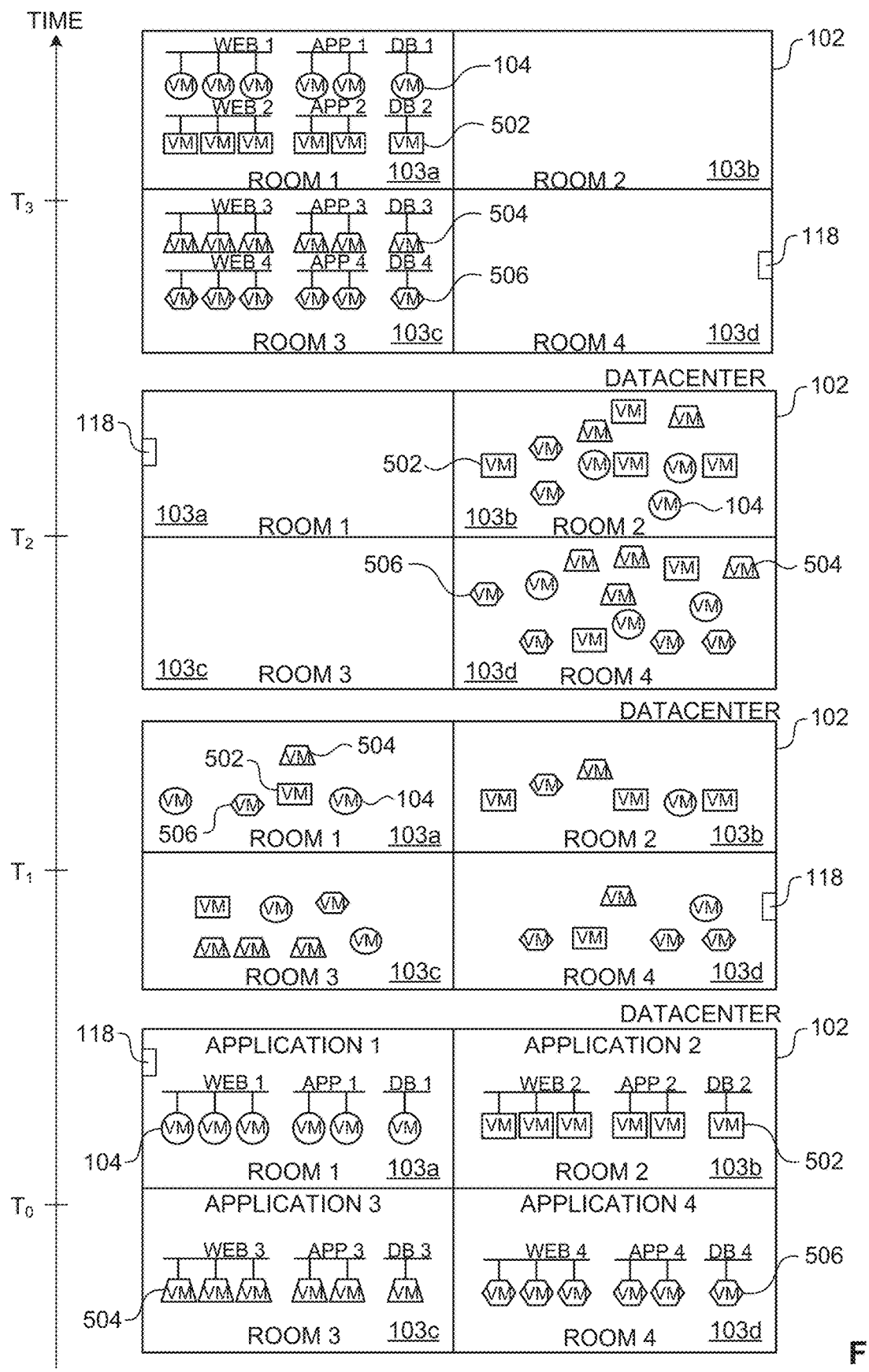
FIG. 5 depicts an example time lapse of a resource utilization sequence to optimize energy requirements in a data center.

FIG. 5 depicts an example time lapse of a resource utilization sequence to optimize energy requirements in the data center 102. In the illustrated example of FIG. 5, the data center 102 is shown at four instants in time represented as a first time (T0), a second time (T1), a third time (T2), and a fourth time (T3). At the first time (T0), the resource utilization analyzer 108 analyzes resource usage information collected from the physical server racks on which the virtual machines 104, 502, 504, 506 are operating. In the illustrated example, virtual machines 104 are operating in the first server room 103a, virtual machines 502 are operating in the second server room 103b, virtual machines 504 are operating in the third server room 103c, and virtual machines 506 are operating in the fourth server room 103d. In the illustrated example, the VMs 104, 502, 504, 506 execute different workloads that include applications (e.g., an 'APP 1' application, an 'APP 2' application, an 'APP 3' application, and an 'APP 4' application) and services (e.g., a 'WEB 1' service, a 'WEB 2' service, a 'WEB 3' service, a 'WEB 4' service, a 'DB 1' service, a 'DB 2' service, a 'DB 3' service, and a 'DB 4' service). During operation, the virtual machines 104, 502, 504, and 506 are migrated by the migrator 114 to various server rooms 103a-d. As such, at the second time (T1), the various server rooms 103a-d include different combinations of the virtual machines 104, 502, 504, 506 which require resources to be utilized to operate all four server rooms 103a-d. To optimize the server rooms, the resource utilization analyzer 108 may receive configuration files from a virtual rack manager (e.g., virtual rack manager 225, 227 of FIG. 2) that identifies which physical hardware components (e.g., physical hardware components 224, 226 of FIG. 2) are operating virtual machines 104, 502, 504, 506. The resource utilization analyzer 108 may analyze the configuration files to determine resource utilization information indicative of physical resource usage of a physical server rack. For example, the resource utilization analyzer 108 may determine that: 1) one or more physical server racks in room 103a is/are operating at a combined 10% resource utilization to run the virtual machines 104, 502, 504, 506, 2) one or more physical server racks in room 103b is/are operating at a combined 5% resource utilization to run the virtual machine 104, 502, 504, 506 3) one or more physical server racks in room 103c is/are operating at a combined 10% resource utilization to run the virtual machines 104, 502, 504, 506, and 4) one or more physical server racks in room 103d is/are operating at a combined 5% resource utilization to run the virtual machines 104, 502, 504, 506. In some examples, the resource utilization analyzer 108 determines the resource utilization information based on the configuration files to include a total quality of hardware resources (e.g., a number of server hosts) utilized and/or multiple total quantities of different types of hardware resources utilized (e.g., total CPUs, total network interface cards, total data store components, total memory components, total graphics processing units (GPUs), etc.). The resource utilization analyzer 108 forwards this information to the workload authorizer 110 for further processing.

The example workload authorizer 110 determines an amount of heat generated by a physical rack based on the resource utilization information from the resource utilization analyzer 108. For example, the workload authorizer 110 determines an amount of heat generated by a physical server rack based on the resource utilization information, and compares the amount of heat to a threshold amount of heat. In some examples, the workload authorizer 110 determines the amount of heat by utilizing the tables illustrated in FIGS. 11A, 11B, 12A and 12B. As such, the workload authorizer 110 determines which virtual machines 104, 502, 504, 506 to migrate to reduce the amount of heat generated by the physical server racks in the server rooms. For example, the workload authorizer 110 identifies that all virtual machines 104, 502, 504, 506 are to migrate to rooms 103b and 103d, and rooms 103a and 103c are to be placed in a low-power state to reduce heat generation, as illustrated at the third time (T2).

At time (T2), the migrator 114 migrates the virtual machines 104, 502, 504, 506 of rooms 103a and 103c to rooms 103b and 103d based on the processes carried out by the decision engine 106. As such, the physical server racks in rooms 103a and 103c are no longer executing any workloads and can be placed in a low-power state to reduce the amount of power required to cool the physical server racks in rooms 103a and 103c.

At time (T3), the migrator 114 migrates the virtual machines 104, 502, 504, 506 such that they are operating on physical server racks based on the application they are currently running. Further, the migrator 114 migrates the virtual machines to rooms 103a and 103c from rooms 103b and 103d. However, the migrator 114 may rearrange the virtual machines 104, 502, 504, 506 illustrated at time (T2) so that the virtual machines 104, 502, 504, 506 match the virtual machines 104, 502, 504, 506 illustrated at time (T3) without migrating the virtual machines 104, 502, 504, 506 to rooms 103a and 103c. That is, the migration of VMs from time (T2) to time (T3) is for the purpose of organizing the VMs into groups of like applications and/or like services. For example, VMs executing a 'Web 1' service can be executed on one physical rack, VMs executing an 'App 1' application can be executed on the same or a different physical rack depending on resource availability. Thus, although the re-organization of the VMs between time (T2) and time (T3) is shown as including VM migrations between different rooms, such VM re-organization may alternatively be performed while keeping the VMs executing in corresponding ones of the same rooms 103b and 103d as shown at time (T2).

FIG. 6 illustrates example pseudo code 600 that may be implemented in the resource utilization system to optimize energy requirements in the data center 102. For example, the pseudo code 600 may be implemented in the decision engine 106 to determine which physical server racks to migrate virtual machines to and/or from.

While an example manner of implementing the resource utilization manager 100 is illustrated in FIG. 1, one or more of the elements, processes and/or devices illustrated in FIG. 1 may be combined, divided, re-arranged, omitted, eliminated and/or implemented in any other way. Further, the example decision engine 106, the example resource utilization analyzer 108, the example workload authorizer 110, the example power manager 112, the example migrator 114, the example climate control system interface 116, and/or, more generally, the example resource utilization manager 100 of FIG. 1 may be implemented by hardware, software, firmware and/or any combination of hardware, software and/or firmware. Thus, for example, any of the example decision engine 106, the example resource utilization analyzer 108, the example workload authorizer 110, the example power manager 112, the example migrator 114, the example climate control system interface 116, and/or, more generally, the example resource utilization manager 100 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example decision engine 106, the example resource utilization analyzer 108, the example workload authorizer 110, the example power manager 112, the example migrator 114, the example climate control system interface 116, and/or, more generally, the example resource utilization manager 100 is/are hereby expressly defined to include a non-transitory computer readable storage device or storage disk such as a memory, a digital versatile disk (DVD), a compact disk (CD), a Blu-ray disk, etc. including the software and/or firmware. Further still, the example resource utilization manager 100 of FIG. 1 may include one or more elements, processes and/or devices in addition to, or instead of, those illustrated in FIG. 1, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 7:
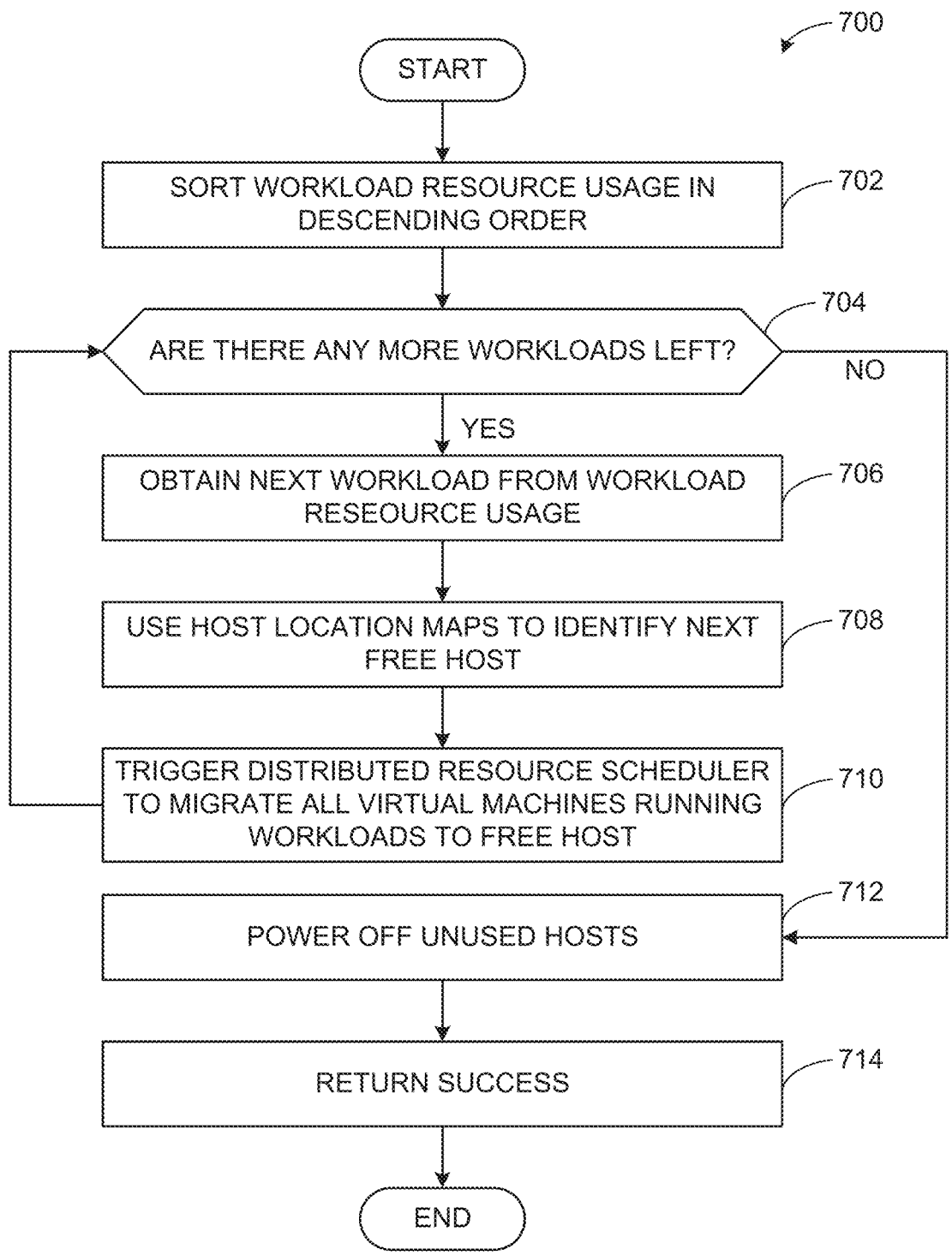
FIG. 7 is a flowchart representative of example machine-readable instructions that may be executed to implement the example decision engine of FIG. 1 and/or the example power predictor of FIG. 3.
Figure 8:
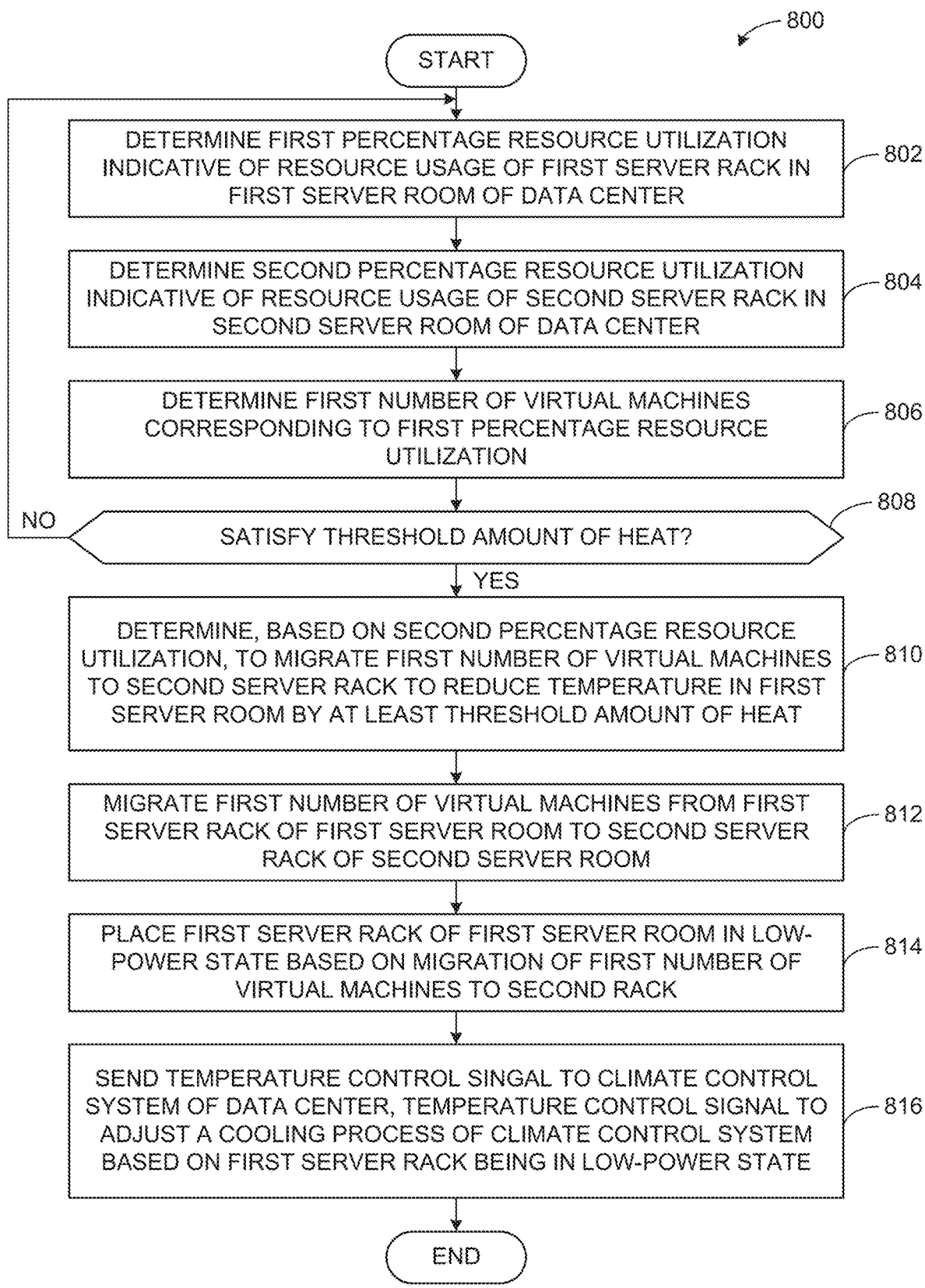
FIG. 8 is a flowchart representative of example machine-readable instructions that may be executed to implement the example decision engine of FIG. 1 and/or the example power predictor of FIG. 3.

Flowcharts representative of example hardware logic, machine readable instructions, hardware implemented state machines, and/or any combination thereof for implementing the resource utilization manager 100 of FIG. 1 are shown in FIGS. 7 and 8. The machine readable instructions may be an executable program or portion of an executable program for execution by a computer processor such as the processor 912 shown in the example processor platform 900 discussed below in connection with FIG. 9. The program may be embodied in software stored on a non-transitory computer readable storage medium such as a CD-ROM, a floppy disk, a hard drive, a DVD, a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowcharts illustrated in FIGS. 7 and 8, many other methods of implementing the example resource utilization manager 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 7 and 8 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

The program 700 of FIG. 7 begins at block 702 at which the resource utilization analyzer 108 sorts workload resource usage in descending order. At block 704, the resource utilization analyzer 108 determines if there are any more workloads left. For example, the resource utilization analyzer 108 checks for workloads remaining to be analyzed for migration. For example, a workload may be an application or may be a service (e.g., a web server service, a database service, etc.). If the example resource utilization analyzer 108 determines that there are more workloads, the process proceeds to block 706 where the example resource utilization analyzer 108 obtains a next workload from workload resource usage. At block 708, the example workload authorizer 110 (FIG. 1) uses a host location map to identify a next free host. An example host location map stores host identifiers (e.g., media access control (MAC) addresses) in association with physical locations (e.g., server rooms) in the data center 102 of the hosts. In the illustrated example, the host location map also shows resource availability of each host to determine if it can receive one or more migrated VMs. For example, the workload authorizer 110 uses a host location map which identifies a host by a unique identifier (e.g., a MAC address) to determine a free host that has available capacity to take on VMs executing a workload. At block 710, the example distributed resource scheduler 316 (FIG. 3) migrates all virtual machines running the workload to the free host. The process then returns to block 704 where the resource utilization analyzer 108 determines if there are any more workloads left. If the resource utilization analyzer 108 determines that no more workloads are left, the process proceeds to block 712 where the example power manager 112 (FIG. 1) powers off unused hosts. At block 714, the decision engine 106 (FIGS. 1 and 3) returns a success communication. The example process 700 ends.

The program 800 of FIG. 8 begins at block 802 at which the resource utilization analyzer 108 (FIG. 1) determines a first percentage resource utilization indicative of resource usage of a first server rack in a first server room in a data center. At block 804, the example resource utilization analyzer 108 determines a second percentage resource utilization indicative of resource usage of a second server rack in a second server room in a data center. At block 806, the example workload authorizer 110 (FIG. 1) determines a first number of virtual machines corresponding to the first percentage resource utilization. At block 808, the workload authorizer 110 determines if the first number of virtual machines generate an amount of heat that satisfies a threshold amount of heat. For example, the workload authorizer 110 determines that the first number of virtual machines corresponding to the first percentage resource utilization cause the first server rack to generate a threshold amount of heat. If heat generated by the first number of virtual machines does not satisfy the threshold, the process returns to block 802. If heat generated by the first number of virtual machines does satisfy the threshold, the example workload authorizer 110 determines, based on the second percentage resource utilization, to migrate the first number of virtual machines to the second server rack in the second server room to reduce a heat generation in the first server room by at least the threshold amount of heat (block 810). At block 812, the example migrator 114 (FIG. 1), migrates the first number of virtual machines from the first server rack of the first server room to the second server rack of the second server room. At block 814, the example power manager 112 (FIG. 1) places the first server rack in the first server room in a low-power state based on the migration of the first number of the virtual machines to the second rack in the second server room. At block 816, the example climate control system interface 116 (FIG. 1) sends a temperature control signal to the example climate control system 113 (FIG. 1) of the data center 102, the temperature control signal to adjust a cooling process of the climate control system 113 based on the first server rack being in the low-power state. The example process 800 ends.

Figure 9:
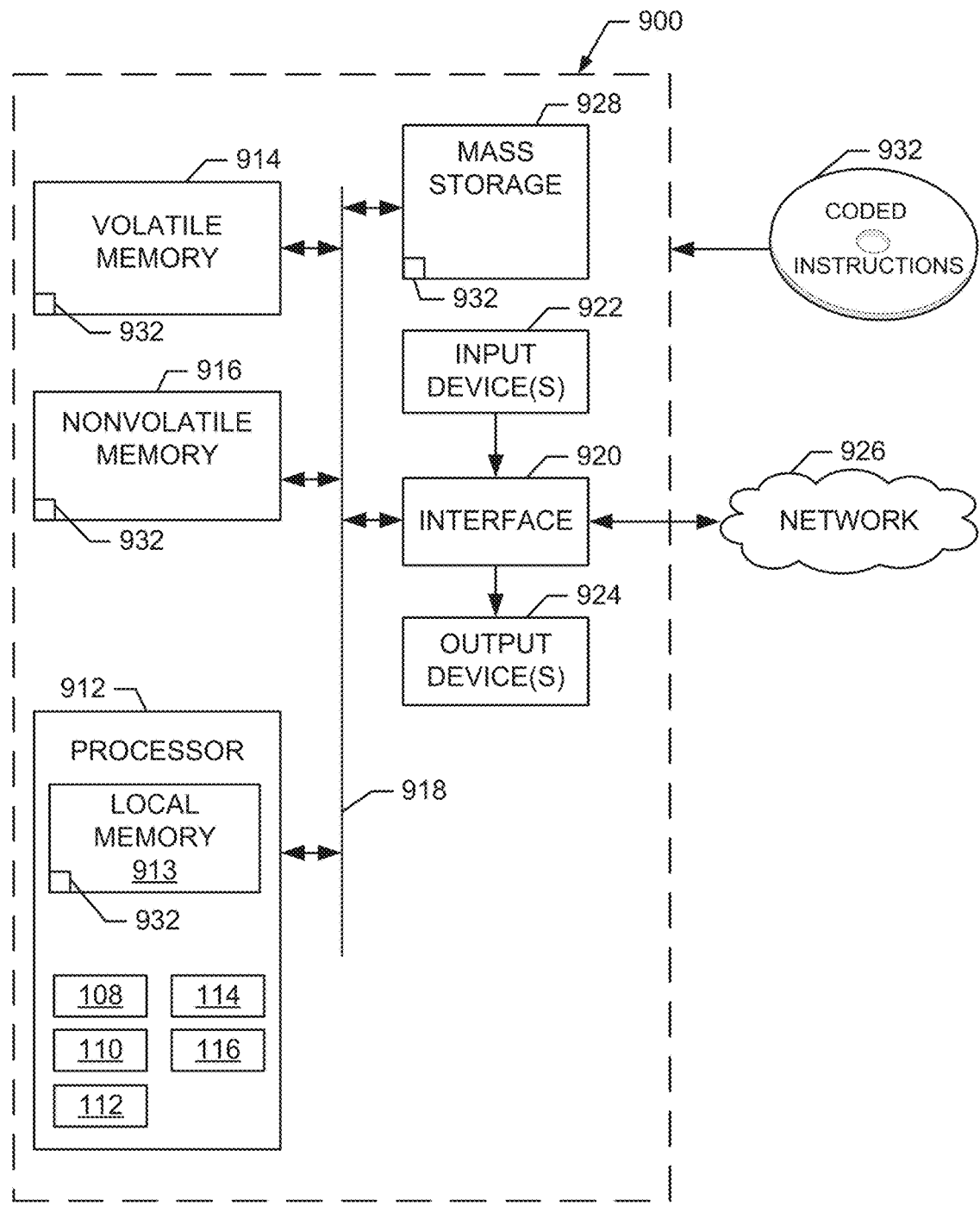
FIG. 9 is an example processing system structured to execute the example machine-readable instructions of FIGS. 7 and 8 to implement the example decision engine of FIG. 1 to migrate virtual machines to adjust a climate control system of a data center.

FIG. 9 is a block diagram of an example processor platform 900 structured to execute the instructions of FIGS. 7 and 8 to implement the resource utilization manager 100 of FIG. 1. The processor platform 900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 900 of the illustrated example includes a processor 912. The processor 912 of the illustrated example is hardware. For example, the processor 912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example decision engine 106, the example resource utilization analyzer 108, the example workload authorizer 110, the example power manager 112, the example migrator 114, the example climate control system interface 116, and/or, more generally, the example resource utilization manager 100.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), a Bluetooth® interface, a near field communication (NFC) interface, and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 900 of the illustrated example also includes one or more mass storage devices 928 for storing software and/or data. Examples of such mass storage devices 928 include floppy disk drives, hard drive disks, compact disk drives, Blu-ray disk drives, redundant array of independent disks (RAID) systems, and digital versatile disk (DVD) drives.

The machine executable instructions 932 of FIGS. 7 and 8 may be stored in the mass storage device 928, in the volatile memory 914, in the non-volatile memory 916, and/or on a removable non-transitory computer readable storage medium such as a CD or DVD.

In addition to utilizing resources for efficiently operating a climate control system to cool rooms in a data center, there are problems faced with expenses of cooling the multiple spaces in a data center and running multiple hardware resources in the data center. For example, data centers may attempt to identify future power needs in order to lock in price rates early for future power needs. However, ordering too much power for such future needs leads to unnecessarily spent capital, and ordering too little power may lead to paying significantly increased prices to order instant on-demand power as needed for unforeseen spikes and excess energy needs. Additionally, overly high temperatures are known to adversely affect electrical properties of semiconductors which could lead to poor CPU computational performance, computational errors, reduced memory and/or storage integrity, and in some cases hardware resource failures. Examples disclosed herein provide a power predictor that utilizes thermocouples to identify ambient air temperatures and verify workload capacities in order to efficiently determine future power provisions for running a data center.

Figure 10:
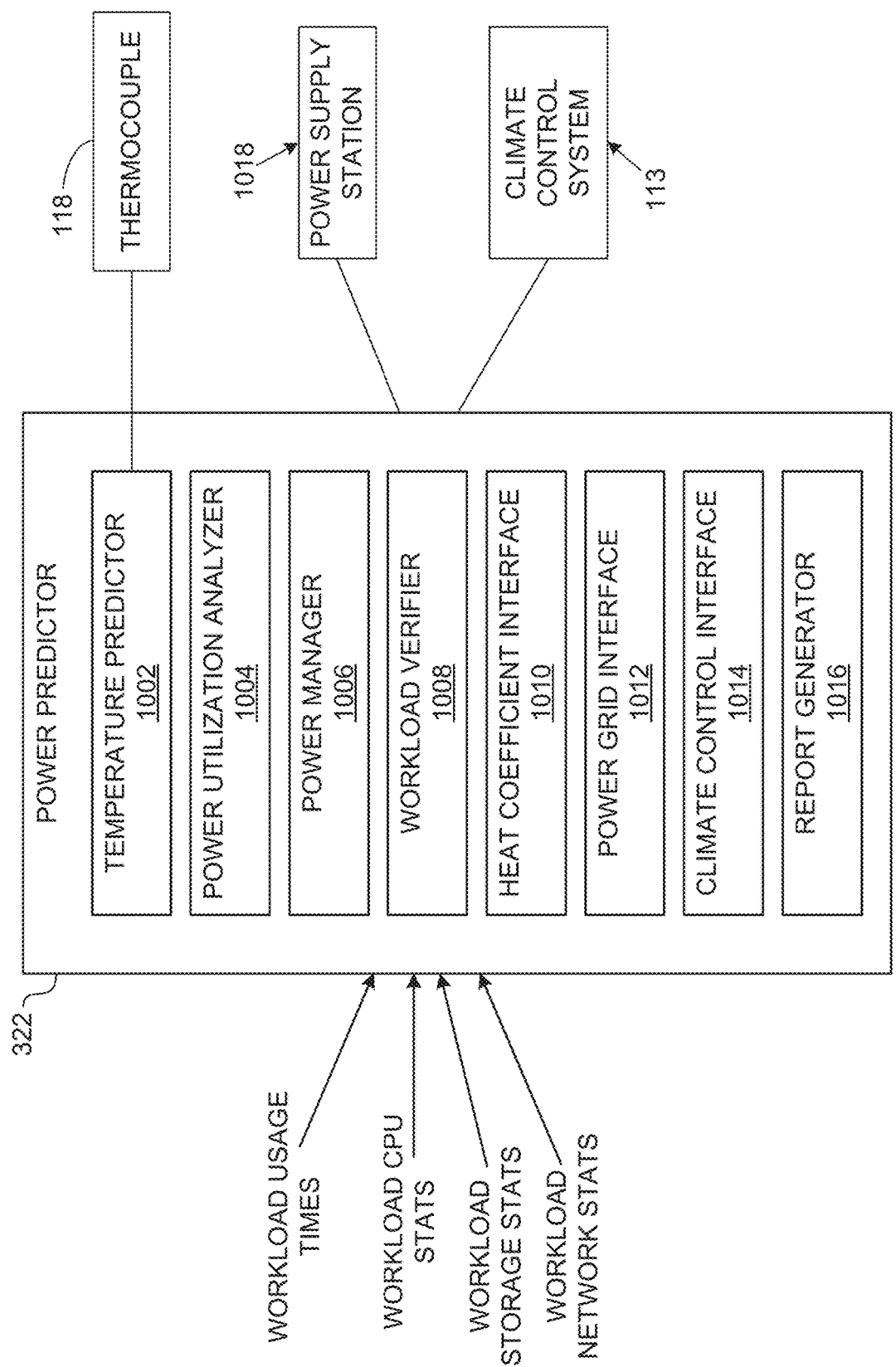
FIG. 10 is an example power predictor to optimize energy requirements in a data center in accordance with teachings of this disclosure.

FIG. 10 illustrates the example power predictor 322 of FIGS. 3 and 4 in accordance with the teachings of this disclosure. The power predictor 322 of the illustrated example includes an example temperature predictor 1002, an example power utilization analyzer 1004, an example power manager 1006, an example workload verifier 1008, an example heat coefficient interface 1010, an example power grid interface 1012, an example climate control interface 1014, and an example report generator 1016.

The example power predictor 322 is provided with the temperature predictor 1002 to determine a predicted combined ambient air temperature of the data center 102 during a future duration. For example, the temperature predictor 1002 may utilize thermocouples (e.g., thermocouple 118 illustrated in FIG. 1 and any other one or more thermocouples in the data center 102) distributed in the data center 102 to determine the predicted combined ambient air temperature. In some examples, building material temperatures and/or ambient air temperatures can be obtained by thermocouples (e.g., thermocouple 118). In other examples, heat transfer from building surfaces to ambient air temperature can be calculated based on measurements from thermocouples (e.g., thermocouple 118) and heat transfer coefficients of FIGS. 12A and 12B. In some examples, the temperature predictor 1002 determines the combined ambient air temperature based on 1) a hardware resource ambient air temperature corresponding to heat generated by hardware resources in physical server racks when executing workloads and 2) a facility structure ambient air temperature corresponding to a building structure of the data center. To determine the heat generated by the hardware resources, the example temperature predictor 1002 may utilize the tables 1102, 1104 illustrated in FIGS. 11A-11B and the tables 1202, 1204 illustrated in FIGS. 12A-12B to determine a summation of heat generated by hardware resources executing workloads. In some examples, the power predictor 1002 determines the heat generated by hardware resources for each workload using Equation 1 below, where $f_h$ is a heat conversion function.

$$\text{Heat from a workload} = \Sigma f_h(\text{power from each server}) + f_h(\text{network utilization}) + f_h(\text{storage utilization}) \quad \text{Equation 1}$$

Equation 1 above uses "power from each server" to represent the electrical power consumed by each server to execute its corresponding workload(s), "network utilization" to represent the electrical power consumed based on the amount of network resources utilized to execute workload(s), and "storage utilization" to represent the electrical power consumed based on the amount of storage resources utilized. The power from each server may be determined using Equation 2 below.

$$\text{Power from each server} = \Sigma f_p(\text{CPU usage of each virtual machine on that server}) \quad \text{Equation 2}$$

In Equation 2 above, fp is an electrical power conversion function to convert CPU usage to electrical power. In some examples, CPU usage corresponds to any combination of usage statistics (e.g., a clock speed of the CPU, the number of cores in use, and a core voltage (vcore)). For example, each of these parameters may be changed dynamically for a CPU by a power manager (e.g., power manager 1006) based on workloads to achieve increased power efficiency of the CPU. For example, when fewer workloads and/or less CPU-intensive workloads are executed, a power manager may reduce a clock speed and/or core voltage relative to when higher workloads are executed. Also, when fewer VMs are active, the power manager and/or the HMS 208, 214 (FIGS. 2 and 3) may reduce the number of active cores relative to when more VMs are active on a server. In some examples, the CPU usage of each virtual machine used to determine power usage based on the tables 1102, 1104 illustrated in FIGS. 11A-11B. For example, the heat coefficient interface 1010 may process information from the tables 1102, 1104 to determine power usage for the running CPUs, and provide the power usage values to the temperature predictor 1002 to efficiently predict the ambient air temperature based on tables 1202 and 1204. The example tables 1102, 1104, 1202, 1204 are described in more detail below.

The example power predictor 322 is provided with the example power utilization analyzer 1004 to determine a predicted total data center power utilization for the future duration based on a computing power utilization and a climate control power utilization. In some examples, the climate control power utilization is based on a power utilization corresponding to adjusting or conditioning the combined ambient air temperature of the data center 102 to satisfy an ambient air temperature threshold (e.g., 50 degrees, 60 degrees, 70 degrees, etc.). For example, the ambient air temperature threshold is based on an amount of electrical energy required to increase the ambient air temperature to a specified temperature. In some examples, the power utilization analyzer 1004 receives power utilization information from the power grid interface 1012, which interacts with an electrical power utility company that supplies electrical power to the data center 102. In some examples, the power utilization analyzer 1004 interacts with the climate control system 113 via the climate control interface 1014. In some examples, the power utilization analyzer 1004 and/or the power predictor 322 is a machine learning model which can be trained based on power consumption information including workload usage time, workload central processing unit information, workload storage information, and/or workload network statistics to more effectively determine a predicted total data center power utilization ofr a future duration.

The example power predictor 322 is provided with the power manager 1006 to configure a power supply station 1018 to deliver an amount of electrical power to the data center 102 during the future duration to satisfy the predicted total data center power utilization. For example, the temperature predictor 1002 and the power utilization analyzer 1004 may determine that the total combined ambient temperature for the data center 102 is going to increase during a future duration (e.g., 2 days into the future, 1 week into the future, one month into the future, one year into the future, etc.). As such, an increase in electrical power to cool the data center 102 is required. The example power manager 1006 configures the power supply station 1018 (e.g., power grid) to deliver an amount of electrical power during the future duration to satisfy power requirements for running the climate control system 113 to cool the data center 102 in response to the increase in temperature. In some examples, the power supply station 1018 can be an on-site power regulator/conditioner that interfaces with a power utility company and receives power. Alternatively, the power supply station 1018 can be a third-party power supply station of a utility company that receives power orders from customers (e.g., the data center operator) and regulates the amount of power provided to those customers based on the customer orders.

The example workload verifier 1008 verifies that the data center 102 can handle the predicted increase for the future duration. For example, the workload verifier 1008 monitors information from physical server racks such as workload usage times, workload CPU statistics, workload storage statistics, workload network statistics, and/or utilization information to determine if the physical server racks can handle the increase in workloads for the future duration. In some example, the workload verifier 1008 may determine that the physical sever racks in a first room are unable to handle an increase in workloads, but may determine that physical server racks in a second room can handle an increase in workloads. As such, the workload verifier 1008 may verify the workloads and/or increase in required power for the future duration.

The example report generator 1016 generates a report for the future duration. For example, the report generator 1016 may generate a report indicating the amount of electrical power that is required to power the data center during the future duration. For example, the report generator 1016 includes an amount of electrical power that is required to cool the data center during the future duration and operate the computing resources of the data center 102 during the future duration. The report generator 1016 of the illustrated example may utilize the power grid interface 1012 and the climate control interface 1014 to interact with the power supply station 1018 and/or the climate control system 113 to increase/decrease electrical power required to operate and cool the data center 102. For example, the report generator 1016 may generate a predicted electrical energy power supply order which is sent to the power supply station 1018 via the power grid interface 1012. In some examples, the predicted electrical energy power supply order can be predicted based on future customer workload orders, historical peak operating conditions, future technology upgrades, and/or data center expansions. The power supply station 1018 in turn delivers the electrical power indicated in the predicted electrical energy power supply order.

FIGS. 11A-11B depict example power usage tables 1102, 1104 for example central processing units. For example, FIG. 11A is a Power PC CPU power usage table 1102, and FIG. 11B is an Intel CPU power usage table 1104. The example power usage tables 1102, 1104 may be utilized by the decision engine 106 and/or the power predictor 322 to determine power utilization measurements, temperature measurements, heat generation measurements, etc. For example, the power usage tables 1102, 1104 illustrates power generated by certain manufacturer's processors. The example tables 1102, 1104 may be provided by a manufacturer and indicate power usage of processors. The power values illustrated in the tables 1102, 1104 may be utilized in connection with either Equation 1 and/or 2 to determine the heat generated by a CPU.

FIGS. 12A-12B depicts example material coefficient tables 1202, 1204 that may be utilized to determine heat generated by a data center. For example, FIG. 12A is a heat transfer coefficients table 1202, and FIG. 12B is a thermal coefficients of power table 1204. The example material coefficient tables 1202, 1204 may be utilized by the decision engine 106 and/or the power predictor 322 to determine heat measurements, temperature measurements, heat generation measurements, etc. For example, the tables 1102, 1104 provide the power values, which the decision engine 106 and/or the power predictor 322 may utilize with the material coefficient tables 1202, 1204 to determine an amount of heat generated by a CPU and, in turn, a physical server rack. For example, the decision engine 106 and/or the power predictor 322 may utilize the values from tables 1102, 1104, 1202, and 1204 with Equations 1 and 2 to determine the amount of heat generated by a CPU based on the CPU's material composition and known power usage (e.g, from tables 1102, 1104. That is, the decision engine 106 and/or the power predictor 322 can predict the amount of heat that a physical server rack may generate based on the amount of power consumed by the physical server rack to execute its workloads, using corresponding thermal coefficients of power of the thermal coefficients of power table 1204 (FIG. 12B) for appropriate material types of hardware to types of hardware to determine corresponding generated heat by the hardware based on the power consumed by the hardware, and using corresponding heat transfer coefficients from the heat transfer coefficients table 1202 (FIG. 12A) for appropriate material types of hardware to determine heat transferred to ambient air from the hardware based on the generated heat by the hardware. Alternatively, the decision engine 106 and/or the power predictor 322 may utilize thermal design power tables (not shown) provided by manufacturers to determine the heat generated by physical hardware resources of the data center 102. For example, the thermal design power tables indicate an expected amount of heat to be generated by physical hardware resources based on a clock speed of a CPU. As such, the decision engine 106 and/or the power predictor 322 are capable of predicting a future temperature based on the predicted heat to be generated for a future duration based on a future predicted amount of workloads. This allows the decision engine 106 and/or the power predictor 322 to more accurately and efficiently operate the climate control system 113, and the physical server racks 202, 204, as well as more accurately and efficiently interact with the power supply station 1018.

While an example manner of implementing the power predictor 322 of FIG. 3 is illustrated in FIG. 10, one or more of the elements, processes and/or devices illustrated in FIG. 10 may be combined, divided, re-arranged, omitted, eliminated and/or implemented in any other way. Further, the example temperature predictor 1002, the example power utilization analyzer 1004, the example power manager 1006, the example workload verifier 1008, the example heat coefficient interface 1010, the example power grid interface 1012, the example report generator 1016, and/or, more generally, the example power predictor 322 of FIG. 3 may be implemented by hardware, software, firmware and/or any combination of hardware, software and/or firmware. Thus, for example, any of the example temperature predictor 1002, the example power utilization analyzer 1004, the example power manager 1006, the example workload verifier 1008, the example heat coefficient interface 1010, the example power grid interface 1012, the example report generator 1016, and/or, more generally, the example power predictor 322 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example temperature predictor 1002, the example power utilization analyzer 1004, the example power manager 1006, the example workload verifier 1008, the example heat coefficient interface 1010, the example power grid interface 1012, the example report generator 1016, and/or, more generally, the example power predictor 322 is/are hereby expressly defined to include a non-transitory computer readable storage device or storage disk such as a memory, a digital versatile disk (DVD), a compact disk (CD), a Blu-ray disk, etc. including the software and/or firmware. Further still, the example power predictor 322 of FIG. 3 may include one or more elements, processes and/or devices in addition to, or instead of, those illustrated in FIG. 10, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 13:
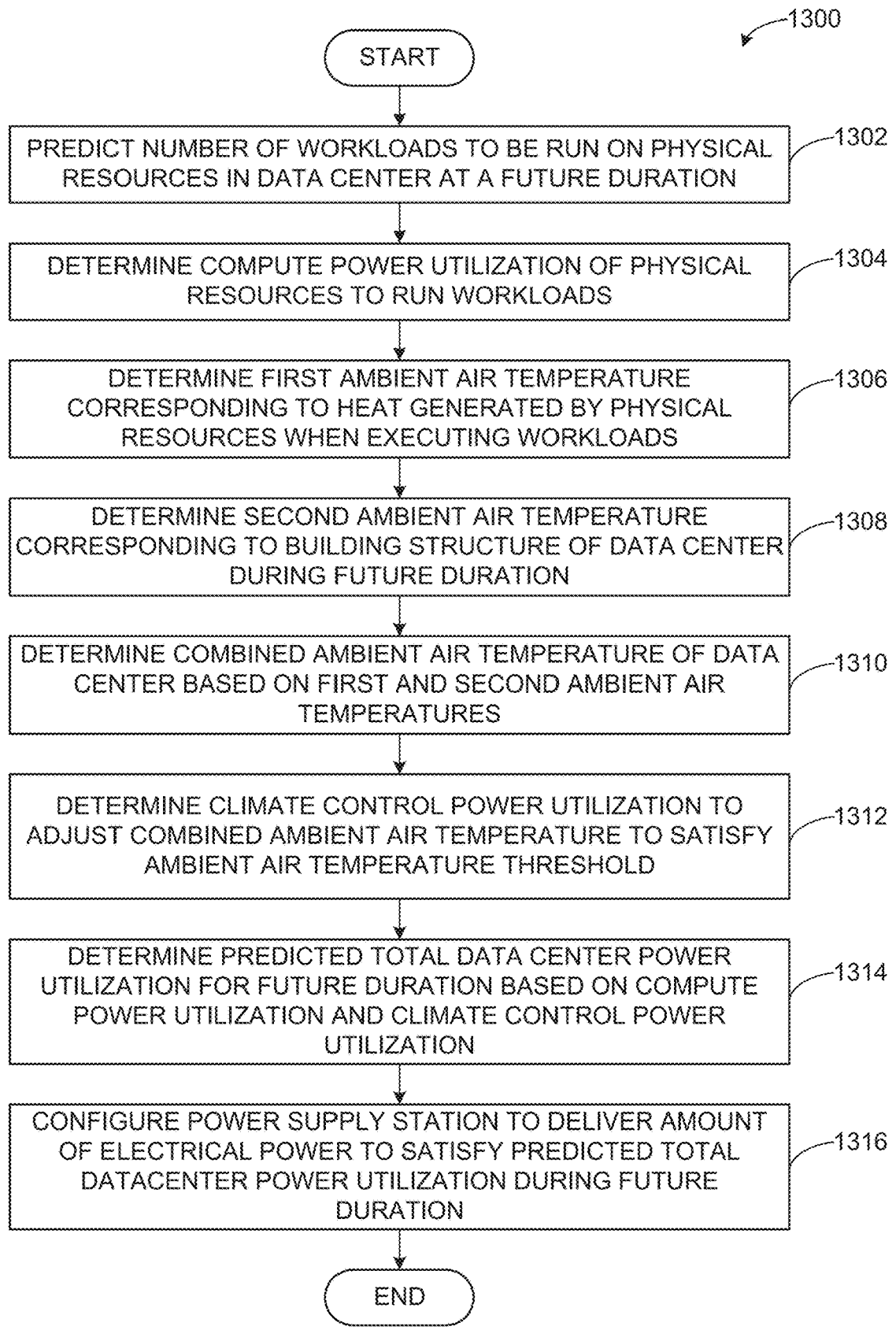
FIG. 13 is a flowchart representative of example machine-readable instructions that may be executed to implement the example decision engine of FIG. 1 and/or the example power predictor of FIGS. 3 and 10.

A flowchart representative of example hardware logic, machine readable instructions, hardware implemented state machines, and/or any combination thereof for implementing the power predictor 322 of FIG. 10 is shown in FIG. 13. The machine readable instructions may be an executable program or portion of an executable program for execution by a computer processor such as the processor 1412 shown in the example processor platform 1400 discussed below in connection with FIG. 14. The program may be embodied in software stored on a non-transitory computer readable storage medium such as a CD-ROM, a floppy disk, a hard drive, a DVD, a Blu-ray disk, or a memory associated with the processor 1412, but the entire program and/or parts thereof could alternatively be executed by a device other than the processor 1412 and/or embodied in firmware or dedicated hardware. Further, although the example program is described with reference to the flowchart illustrated in FIG. 13, many other methods of implementing the example power predictor 322 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 3 and 10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

The program 1300 begins at block 1302 at which the example workload verifier 1008 (FIG. 10) predicts a number of workloads to be run on physical resources in a data center 102 at a future duration (block 1302). In some examples, the future duration can be selected by a user (e.g., a future duration of 12 days, a future duration of 12 weeks, a future duration of 12 months, etc.). At block 1304, the example power utilization analyzer 1004 (FIG. 10) determines a compute power utilization of physical resources to run the workloads. At block 1306, the example temperature predictor 1002 (FIG. 10) determines a first ambient air temperature corresponding to heat generated by the physical resources when executing the workloads. At block 1308, the example temperature predictor 1002 (FIG. 10) determines a second ambient air temperature corresponding to a building structure of the data center 102 during the future duration. At block 1310, the example temperature predictor 1002 determines a combined ambient air temperature of the data center 102 based on the first and second ambient air temperatures. At block 1312, the example power utilization analyzer 1004 determines a climate control power utilization to adjust (e.g., cool) the combined ambient air temperature to satisfy an ambient air temperature threshold. At block 1314, the example power utilization analyzer 1004 determines a predicted total data center power utilization for the future duration based on the compute power utilization and the climate control power utilization. At block 1316, the example power manager 1006 configures a power supply station 1018 (FIG. 10) to deliver an amount of electrical power to satisfy the predicted total data center power utilization during the future duration. The process 1300 ends.

"Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended. Conjunctions such as "and," "or," and "and/or" are inclusive unless the context clearly dictates otherwise. For example, "A and/or B" includes A alone, B alone, and A with B. In this specification and the appended claims, the singular forms "a," "an" and "the" do not exclude the plural reference unless the context clearly dictates otherwise.

Figure 14:
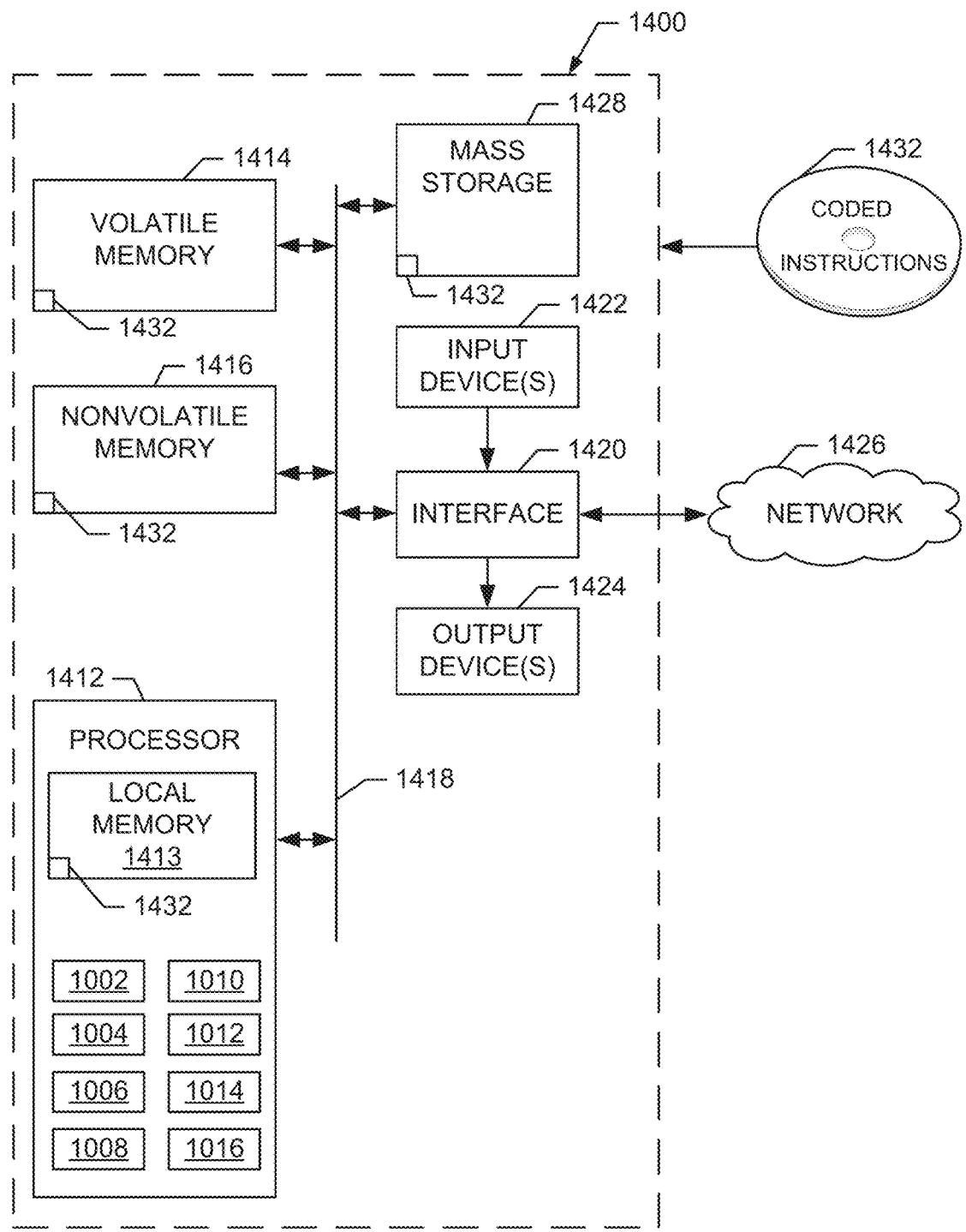
FIG. 14 is an example processing system structured to execute the example machine-readable instructions of FIG. 13 to implement the example power predictor of FIG. 5 to predict a total data center power utilization for a future duration.

FIG. 14 is a block diagram of an example processor platform 1400 structured to execute the instructions of FIG. 13 to implement the power predictor 322 of FIG. 10. The processor platform 1400 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1400 of the illustrated example includes a processor 1412. The processor 1412 of the illustrated example is hardware. For example, the processor 1412 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example temperature predictor 1002, the example power utilization analyzer 1004, the example power manager 1006, the example workload verifier 1008, the example heat coefficient interface 1010, the example power grid interface 1012, the example report generator 1016, and/or, more generally, the example power predictor 322.

The processor 1412 of the illustrated example includes a local memory 1413 (e.g., a cache). The processor 1412 of the illustrated example is in communication with a main memory including a volatile memory 1414 and a non-volatile memory 1416 via a bus 1418. The volatile memory 1414 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1416 may be implemented by flash memory and/or any other desired type of memory device. Access to the main memory 1414, 1416 is controlled by a memory controller.

The processor platform 1400 of the illustrated example also includes an interface circuit 1420. The interface circuit 1420 may be implemented by any type of interface standard, such as an Ethernet interface, a universal serial bus (USB), a Bluetooth® interface, a near field communication (NFC) interface, and/or a PCI express interface.

In the illustrated example, one or more input devices 1422 are connected to the interface circuit 1420. The input device(s) 1422 permit(s) a user to enter data and/or commands into the processor 1412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1424 are also connected to the interface circuit 1420 of the illustrated example. The output devices 1424 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1420 of the illustrated example, thus, typically includes a graphics driver card, a graphics driver chip and/or a graphics driver processor.

The interface circuit 1420 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1426. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1400 of the illustrated example also includes one or more mass storage devices 1428 for storing software and/or data. Examples of such mass storage devices 1428 include floppy disk drives, hard drive disks, compact disk drives, Blu-ray disk drives, redundant array of independent disks (RAID) systems, and digital versatile disk (DVD) drives.

The machine executable instructions 1432 of FIG. 13 may be stored in the mass storage device 1428, in the volatile memory 1414, in the non-volatile memory 1416, and/or on a removable non-transitory computer readable storage medium such as a CD or DVD.

Examples disclosed herein may be used in connection with different types of SDDCs. In some examples, techniques disclosed herein are useful for managing network resources that are provided in SDDCs based on Hyper-Converged Infrastructure (HCI). In examples disclosed herein, HCI combines a virtualization platform such as a hypervisor, virtualized software-defined storage, and virtualized networking in an SDDC deployment. An SDDC manager can provide automation of workflows for lifecycle management and operations of a self-contained private cloud instance. Such an instance may span multiple racks of servers connected via a leaf-spine network topology and connects to the rest of the enterprise network for north-south connectivity via well-defined points of attachment.

Examples disclosed herein may be used with one or more different types of virtualization environments. Three example types of virtualization environment are: full virtualization, paravirtualization, and operating system (OS) virtualization. Full virtualization, as used herein, is a virtualization environment in which hardware resources are managed by a hypervisor to provide virtual hardware resources to a virtual machine (VM). In a full virtualization environment, the VMs do not have access to the underlying hardware resources. In a typical full virtualization, a host OS with embedded hypervisor (e.g., a VIVIWARE® ESXI® hypervisor) is installed on the server hardware. VMs including virtual hardware resources are then deployed on the hypervisor. A guest OS is installed in the VM. The hypervisor manages the association between the hardware resources of the server hardware and the virtual resources allocated to the VMs (e.g., associating physical random-access memory (RAM) with virtual RAM). Typically, in full virtualization, the VM and the guest OS have no visibility and/or access to the hardware resources of the underlying server. Additionally, in full virtualization, a full guest OS is typically installed in the VM while a host OS is installed on the server hardware. Example virtualization environments include VMWARE® ESX® hypervisor, Microsoft HYPER-V® hypervisor, and Kernel Based Virtual Machine (KVM).

Paravirtualization, as used herein, is a virtualization environment in which hardware resources are managed by a hypervisor to provide virtual hardware resources to a VM, and guest OSs are also allowed to access some or all the underlying hardware resources of the server (e.g., without accessing an intermediate virtual hardware resource). In a typical paravirtualization system, a host OS (e.g., a Linux-based OS) is installed on the server hardware. A hypervisor (e.g., the XEN® hypervisor) executes on the host OS. VMs including virtual hardware resources are then deployed on the hypervisor. The hypervisor manages the association between the hardware resources of the server hardware and the virtual resources allocated to the VMs (e.g., associating RAM with virtual RAM). In paravirtualization, the guest OS installed in the VM is configured also to have direct access to some or all of the hardware resources of the server. For example, the guest OS may be precompiled with special drivers that allow the guest OS to access the hardware resources without passing through a virtual hardware layer. For example, a guest OS may be precompiled with drivers that allow the guest OS to access a sound card installed in the server hardware. Directly accessing the hardware (e.g., without accessing the virtual hardware resources of the VM) may be more efficient, may allow for performance of operations that are not supported by the VM and/or the hypervisor, etc.

OS virtualization is also referred to herein as container virtualization. As used herein, OS virtualization refers to a system in which processes are isolated in an OS. In a typical OS virtualization system, a host OS is installed on the server hardware. Alternatively, the host OS may be installed in a VM of a full virtualization environment or a paravirtualization environment. The host OS of an OS virtualization system is configured (e.g., utilizing a customized kernel) to provide isolation and resource management for processes that execute within the host OS (e.g., applications that execute on the host OS). The isolation of the processes is known as a container. Thus, a process executes within a container that isolates the process from other processes executing on the host OS. Thus, OS virtualization provides isolation and resource management capabilities without the resource overhead utilized by a full virtualization environment or a paravirtualization environment. Example OS virtualization environments include Linux Containers LXC and LXD, the DOCKER™ container platform, the OPENVZ™ container platform, etc.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
   a resource utilization analyzer to determine 1) a first percentage resource utilization indicative of resource usage of a first server rack in a first server room in a data center and 2) a second percentage resource utilization indicative of resource usage of a second server rack in a second server room in the data center;
   a workload authorizer to:
      determine that a first number of virtual machines corresponding to the first percentage resource utilization cause the first server rack to generate a threshold amount of heat;
      determine, based on the second percentage resource utilization, to migrate the first number of virtual machines to the second server rack to reduce a temperature in the first server room by at least the threshold amount of heat;
   a migrator to migrate the first number of virtual machines from the first server rack of the first server room to the second server rack of the second server room;
   a power manager to place the first server rack of the first server room in a low-power state based on the migration of the first number of the virtual machines to the second server rack; and
   a climate control system interface to send a temperature control signal to a climate control system of the data center, the temperature control signal to adjust a cooling process of the climate control system based on the first server rack being in the low-power state, at least one of the resource utilization analyzer, the workload authorizer, the migrator, the power manager, or the climate control system interface implemented by a logic circuit.

2. The apparatus of claim 1, wherein the resource utilization analyzer determines the first and second percentage resource utilization based on configuration files from the first and second server racks.

3. The apparatus of claim 1, wherein the climate control system interface is to interact with the climate control system to determine the temperature.

4. The apparatus of claim 3, wherein the temperature is based on heat coefficient tables corresponding to hardware resources of the first and second server racks.

5. The apparatus of claim 1, wherein the first server rack being in the low-power state corresponds to the first server rack being idle.

6. The apparatus of claim 1, wherein the migrator is to migrate the first number of virtual machines to a first hardware resource of the second server rack.

7. A non-transitory computer-readable medium comprising instructions that, when executed, cause one or more processors to at least:
   determine 1) a first percentage resource utilization indicative of resource usage of a first server rack in a first server room in a data center and 2) a second percentage resource utilization indicative of resource usage of a second server rack in a second server room in the data center;
   determine that a first number of virtual machines corresponding to the first percentage resource utilization cause the first server rack to generate a threshold amount of heat;
   determine, based on the second percentage resource utilization, to migrate the first number of virtual machines to the second server rack to reduce a temperature in the first server room by at least the threshold amount of heat;
   migrate the first number of virtual machines from the first server rack of the first server room to the second server rack of the second server room;
   place the first server rack of the first server room in a low-power state based on the migration of the first number of the virtual machines to the second server rack; and
   send a temperature control signal to a climate control system of the data center, the temperature control signal to adjust a cooling process of the climate control system based on the first server rack being in the low-power state.

8. The non-transitory computer-readable medium of claim 7, wherein the instructions are to cause the one or more processors to determine the first and second percentage resource utilization based on configuration files from the first and second server racks.

9. The non-transitory computer-readable medium of claim 7, wherein the instructions are further to cause the one or more processors to interact with the climate control system to determine the temperature.

10. The non-transitory computer-readable medium of claim 9, wherein the temperature is based on heat coefficient tables corresponding to hardware resources of the first and second server racks.

11. The non-transitory computer-readable medium of claim 7, wherein the first server rack being in the low-power state corresponds to the first server rack being idle.

12. The non-transitory computer-readable medium of claim 7, wherein the instructions are to cause the one or more processors to migrate the first number of virtual machines to a first hardware resource of the second server rack.

13. A method comprising:
   determining 1) a first percentage resource utilization indicative of resource usage of a first server rack in a first server room in a data center and 2) a second percentage resource utilization indicative of resource usage of a second server rack in a second server room in the data center;
   determining that a first number of virtual machines corresponding to the first percentage resource utilization cause the first server rack to generate a threshold amount of heat;
   determining, based on the second percentage resource utilization, to migrate the first number of virtual machines to the second server rack to reduce a temperature in the first server room by at least the threshold amount of heat;

migrating the first number of virtual machines from the first server rack of the first server room to the second server rack of the second server room;

placing the first server rack of the first server room in a low-power state based on the migration of the first number of the virtual machines to the second server rack; and sending a temperature control signal to a climate control system of the data center, the temperature control signal to adjust a cooling process of the climate control system based on the first server rack being in the low-power state.

14. The method of claim 13, further including determine the first and second percentage resource utilization based on configuration files from the first and second server racks.

15. The method of claim 13, further including interacting with the climate control system to determine the temperature.

16. The method of claim 15, wherein the temperature is based on heat coefficient tables corresponding to hardware resources of the first and second server racks.

17. The method of claim 13, wherein the first server rack being in the low-power state corresponds to the first server rack being idle.

18. The method of claim 13, wherein the migrating of the first number of virtual machines is to a first hardware resource of the second server rack.

* * * * *